United States Patent
Hsieh et al.

(10) Patent No.: US 12,118,944 B2
(45) Date of Patent: Oct. 15, 2024

(54) CONTROLLERS TO DRIVE DISPLAY LINES

(71) Applicant: Hewlett-Packard Development Company, L.P., Spring, TX (US)

(72) Inventors: Hsing-Hung Hsieh, Taipei (TW); Super Liao, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/997,086

(22) PCT Filed: May 15, 2020

(86) PCT No.: PCT/US2020/033226
§ 371 (c)(1),
(2) Date: Oct. 25, 2022

(87) PCT Pub. No.: WO2021/230883
PCT Pub. Date: Nov. 18, 2021

(65) Prior Publication Data
US 2023/0222980 A1      Jul. 13, 2023

(51) Int. Cl.
*G09G 3/3258*      (2016.01)

(52) U.S. Cl.
CPC ... *G09G 3/3258* (2013.01); *G09G 2310/0213* (2013.01)

(58) Field of Classification Search
CPC ............. G09G 3/32; G09G 2300/0426; G09G 2320/0209; G09G 3/3233
See application file for complete search history.

(56) References Cited

U.S. PATENT DOCUMENTS

| | | | |
|---|---|---|---|
| 6,970,274 B2 | 11/2005 | Morita et al. | |
| 7,365,725 B2 | 4/2008 | Nakayoshi et al. | |
| 7,808,540 B2 | 10/2010 | Cok | |
| 8,847,860 B2 | 9/2014 | Nakamura et al. | |
| 9,204,089 B2 | 12/2015 | Nagano et al. | |
| 9,390,669 B2 | 7/2016 | Kim et al. | |
| 9,570,019 B2 | 2/2017 | Musgrave et al. | |
| 9,970,964 B2 | 5/2018 | Nathan et al. | |
| 2003/0151568 A1* | 8/2003 | Ozawa | H10K 59/1216 345/82 |

(Continued)

FOREIGN PATENT DOCUMENTS

| | | |
|---|---|---|
| CN | 110610677 A | 12/2019 |
| EP | 3355571 A1 | 8/2018 |

(Continued)

*Primary Examiner* — Van N Chow
(74) *Attorney, Agent, or Firm* — Quarles & Brady LLP

(57) ABSTRACT

In examples, an electronic device comprises a camera and a display having a transparent area aligned with the camera. The display comprises a first line corresponding to a pixel row or column of the display, the first line extending from a first end of the display to the transparent area. The display comprises a second line corresponding to the pixel row or column and extending from a second end of the display to the transparent area, the first and second lines separated by a gap. The electronic device includes a controller coupled to the display, the controller to drive the first and second lines consecutively.

14 Claims, 25 Drawing Sheets

(56) References Cited

U.S. PATENT DOCUMENTS

| | | | |
|---|---|---|---|
| 2015/0271392 A1* | 9/2015 | Musgrave | G09G 3/3406 348/207.11 |
| 2019/0089880 A1 | 3/2019 | Murao | |
| 2021/0151483 A1* | 5/2021 | Feng | H01L 27/14649 |

FOREIGN PATENT DOCUMENTS

| KR | 10-2017-0096565 A | 8/2017 |
|---|---|---|
| WO | 2019/109903 A1 | 6/2019 |

* cited by examiner

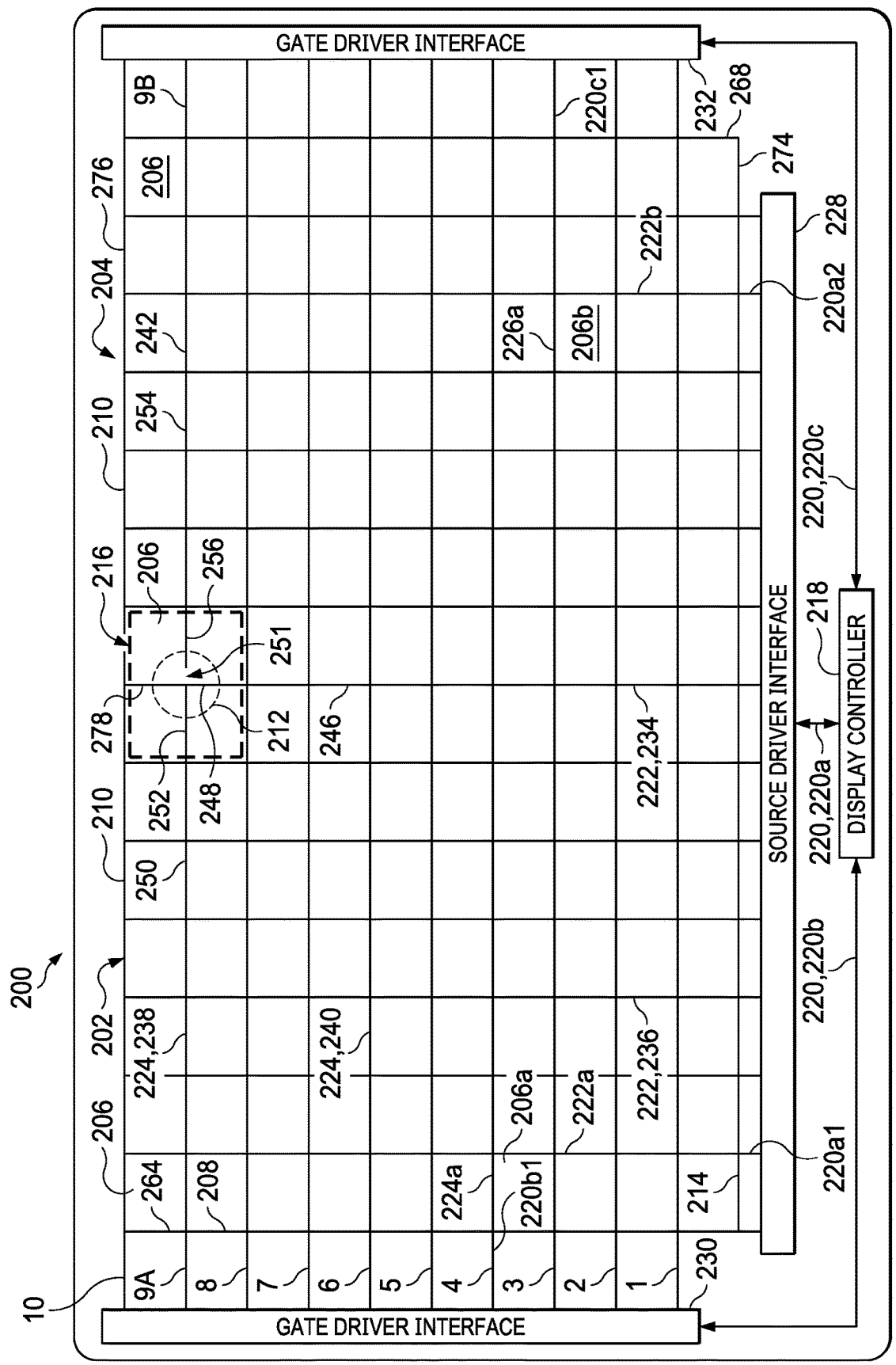
FIG. 2A1

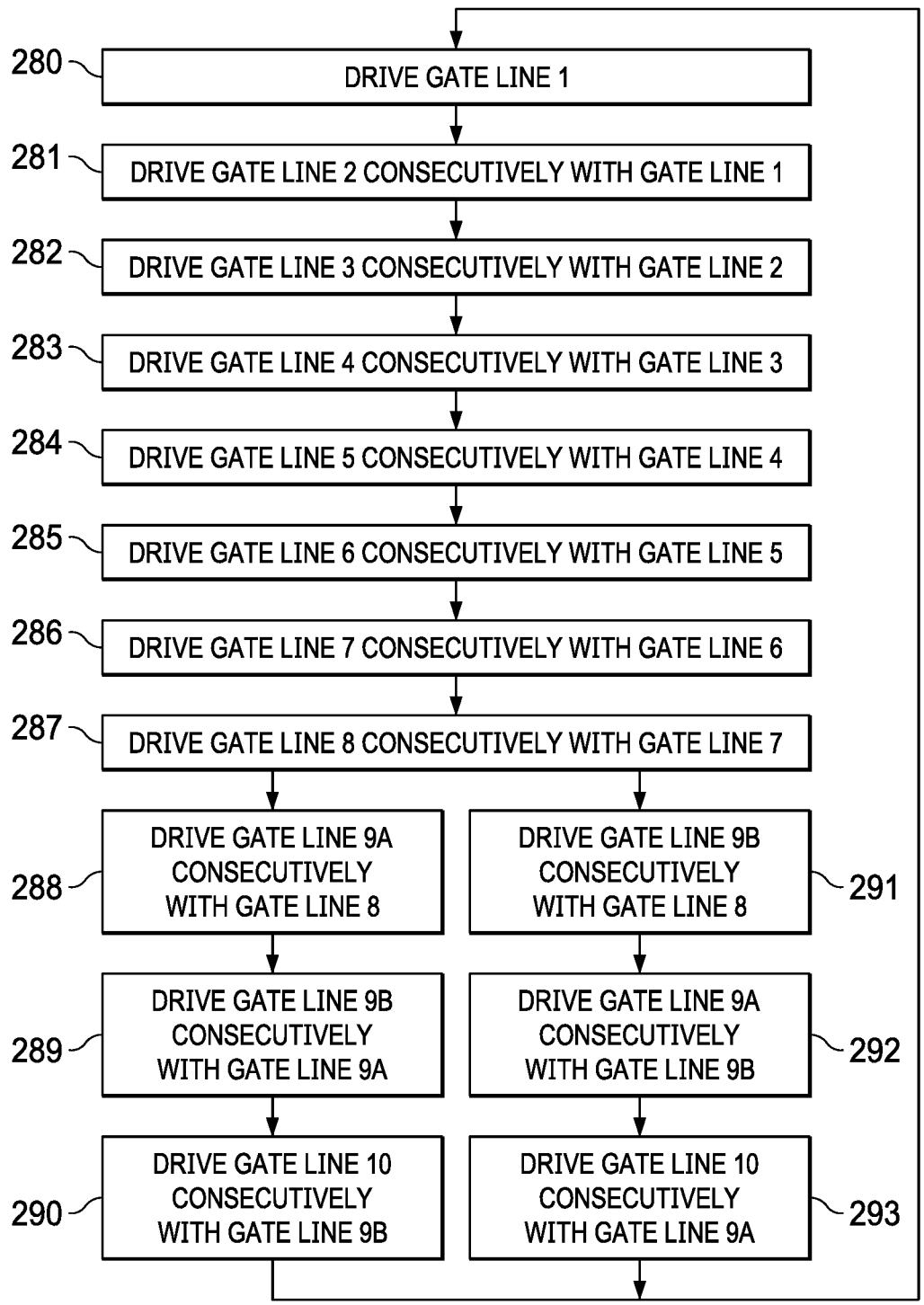
FIG. 2A2

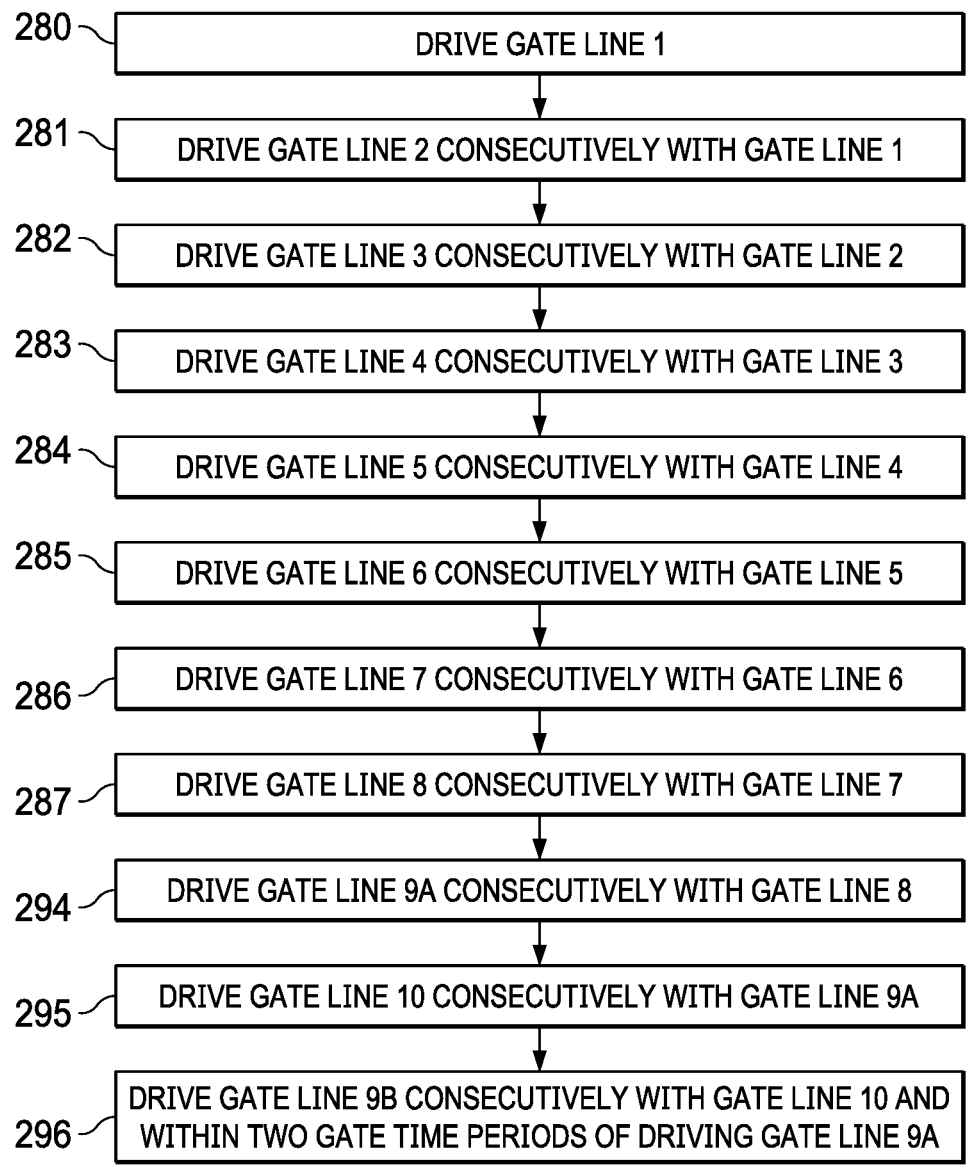
FIG. 2A3

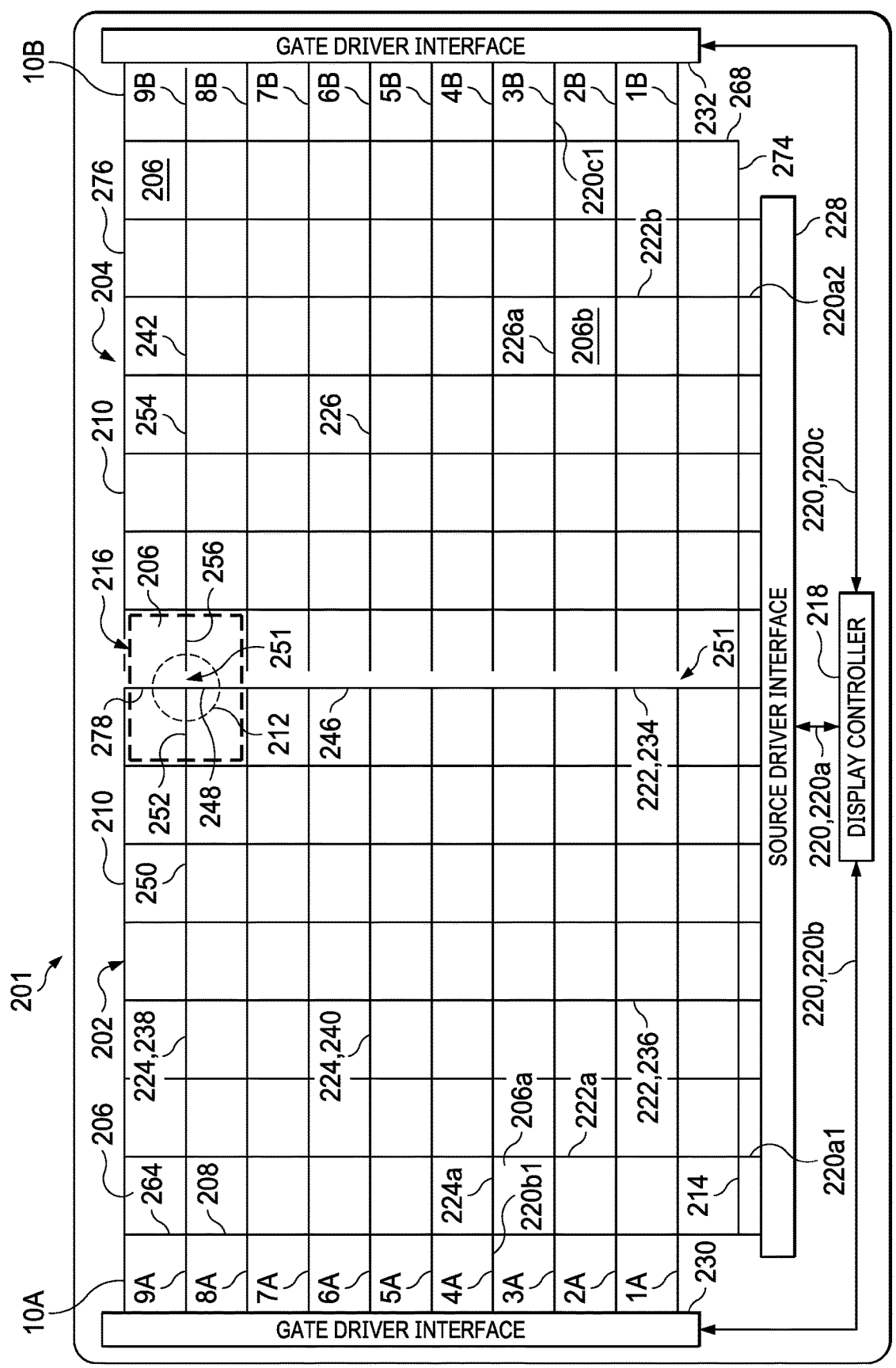
FIG. 2B1

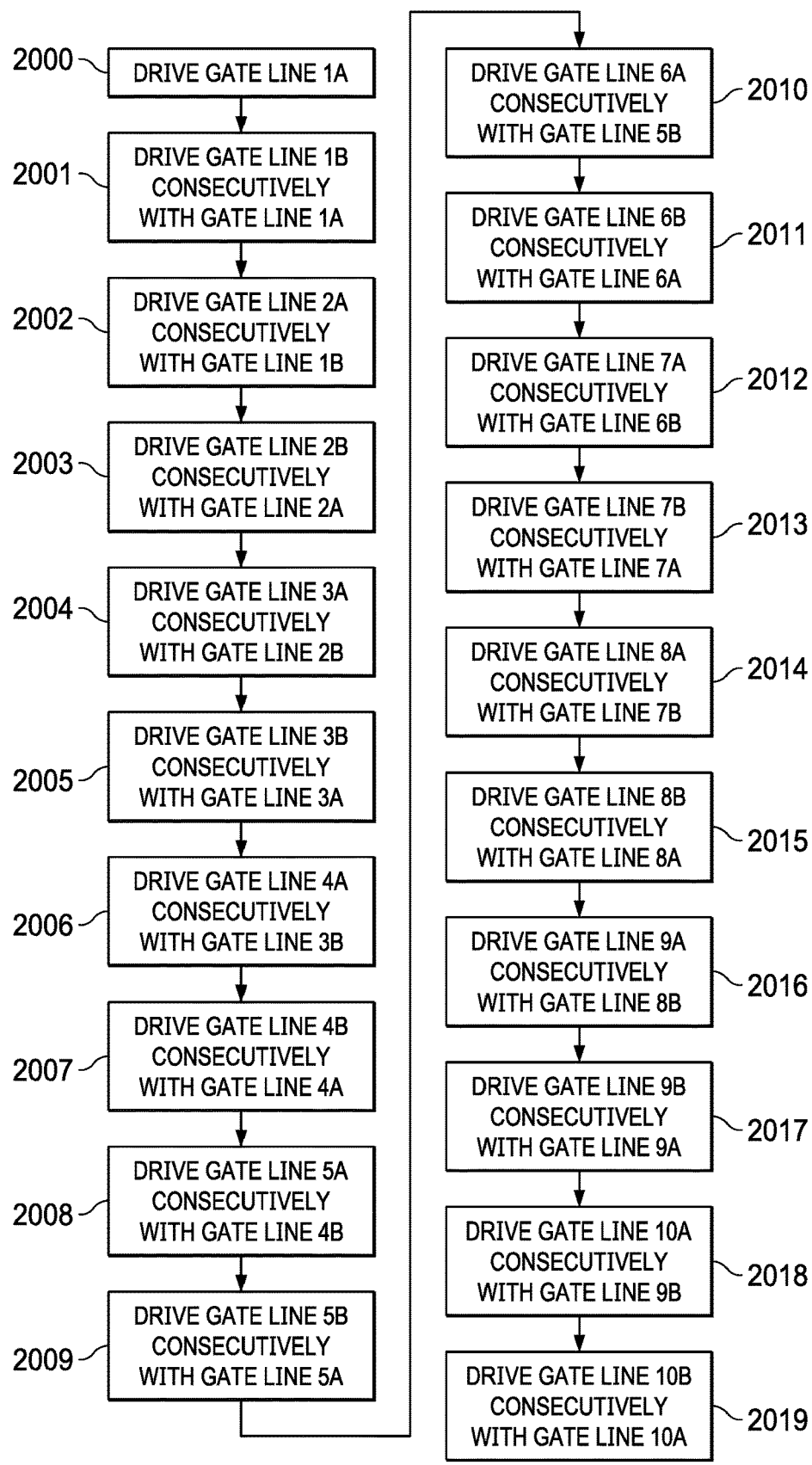
FIG. 2B2

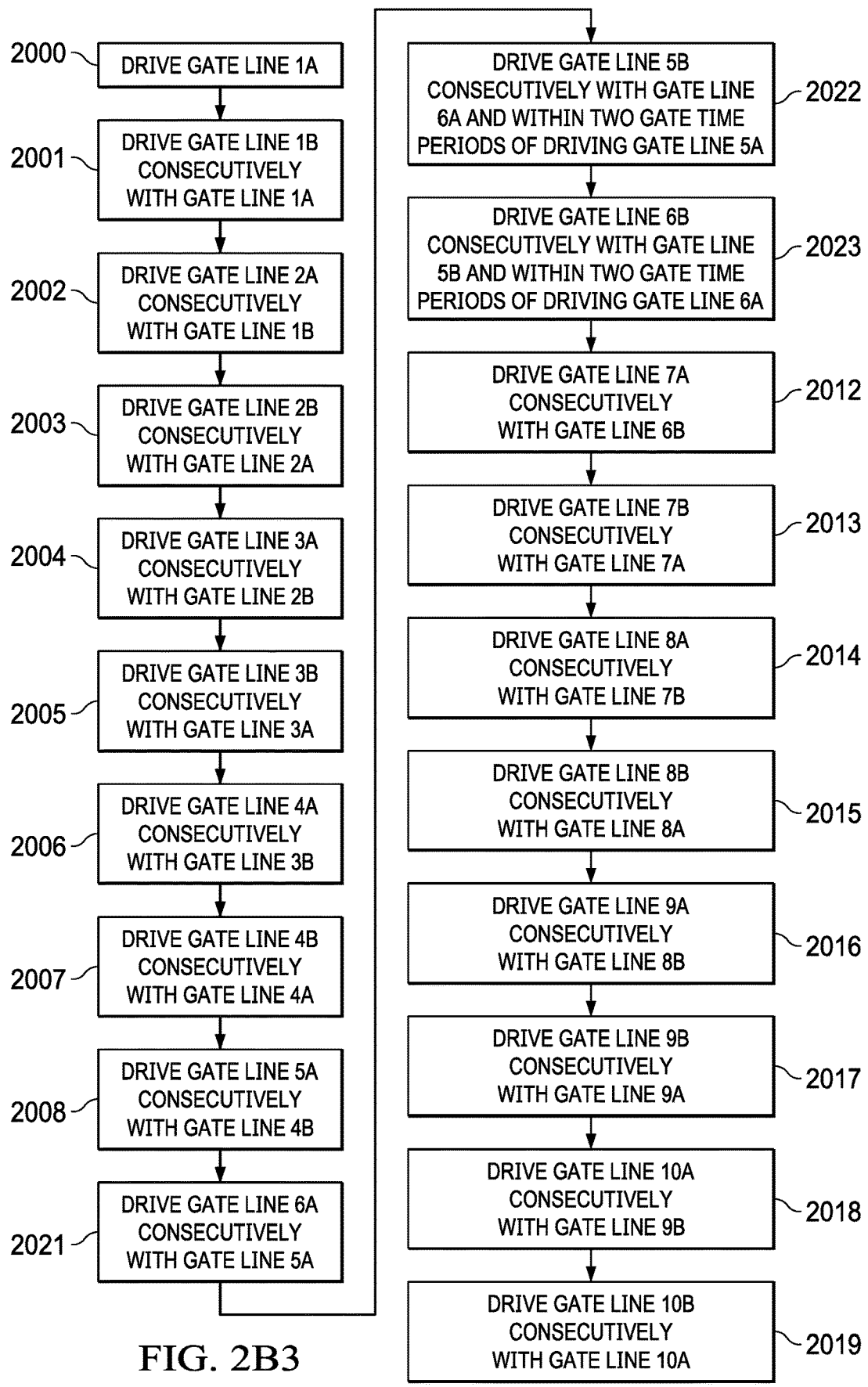
FIG. 2B3

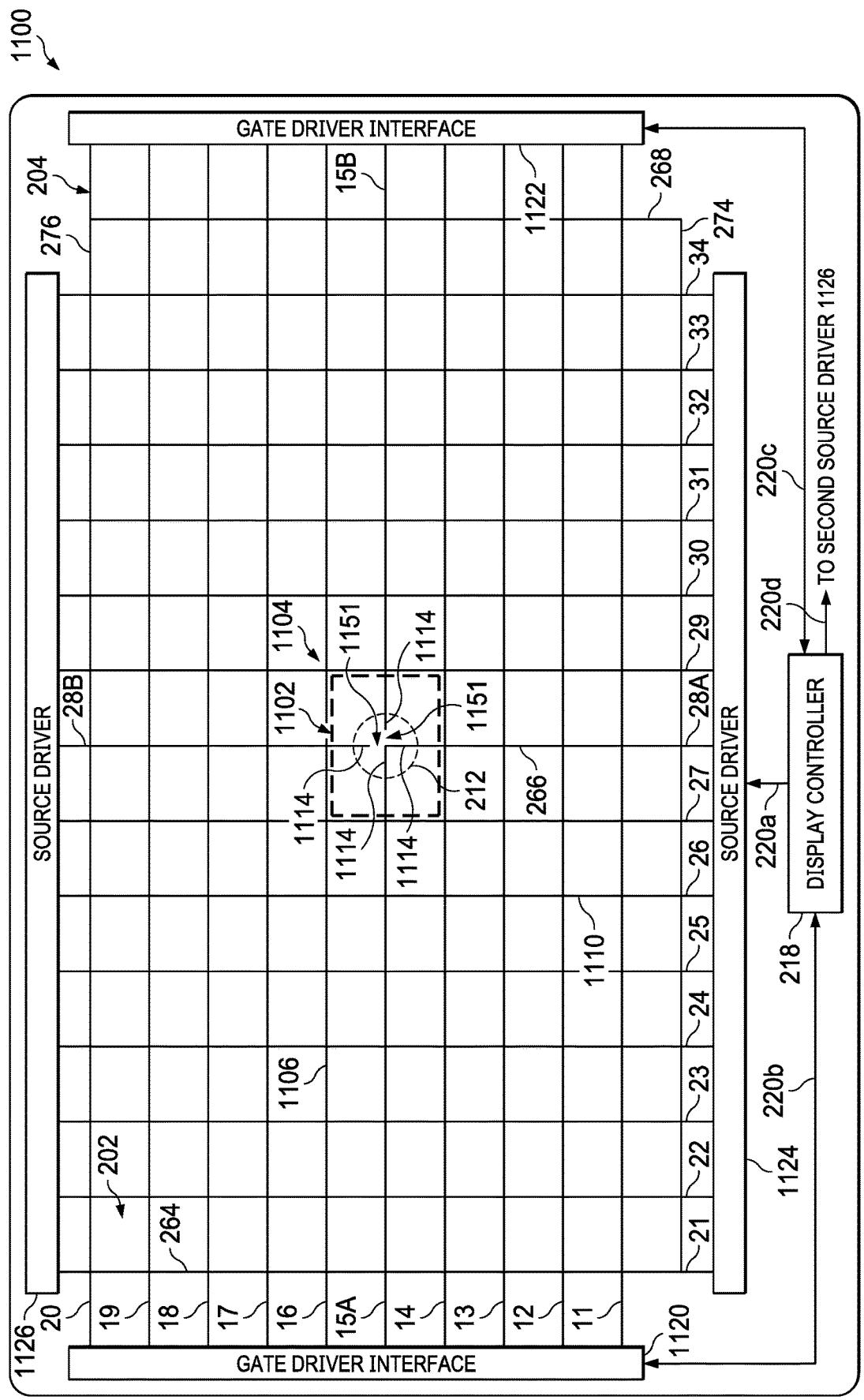
FIG. 5A1

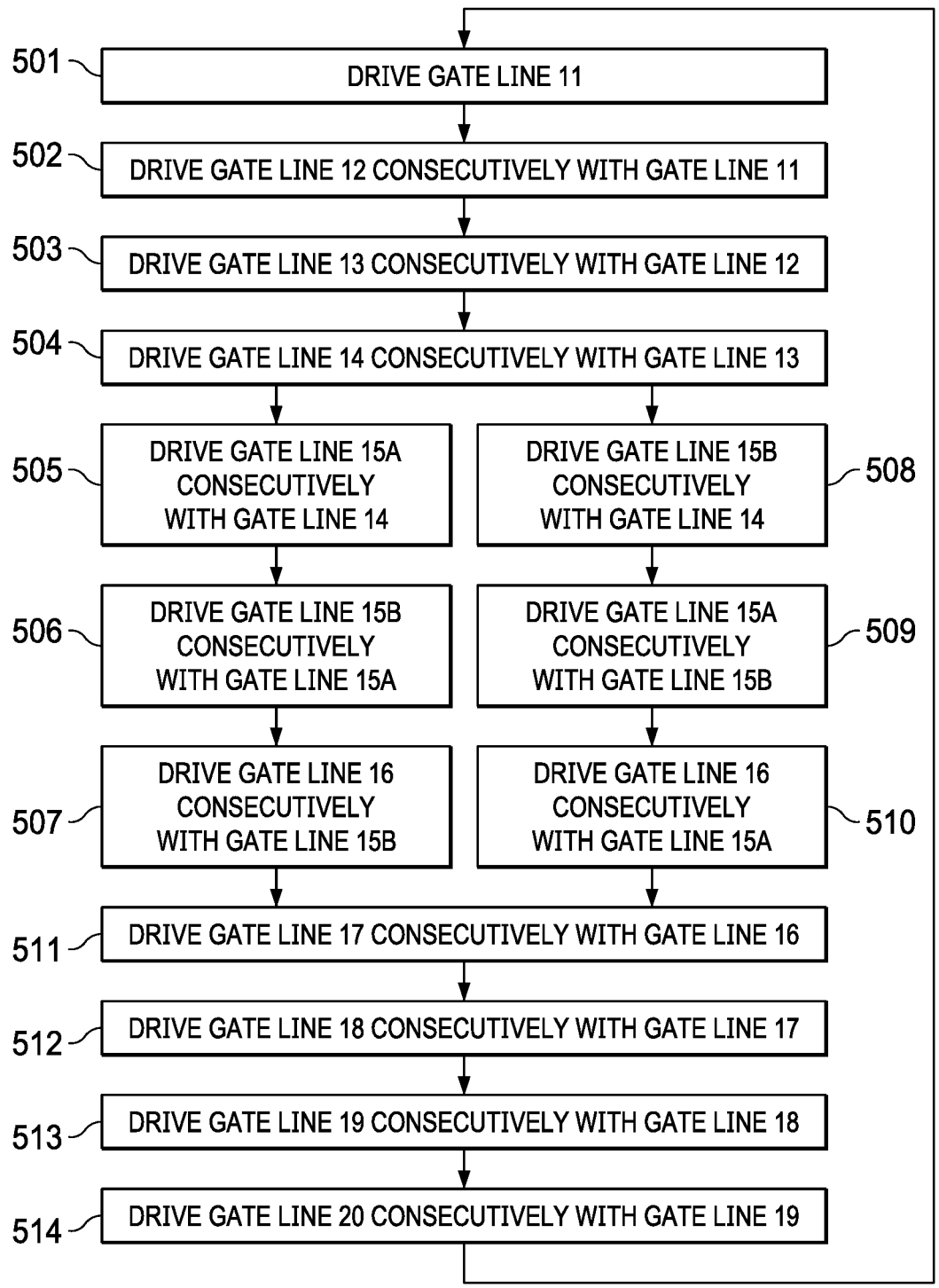
FIG. 5A2

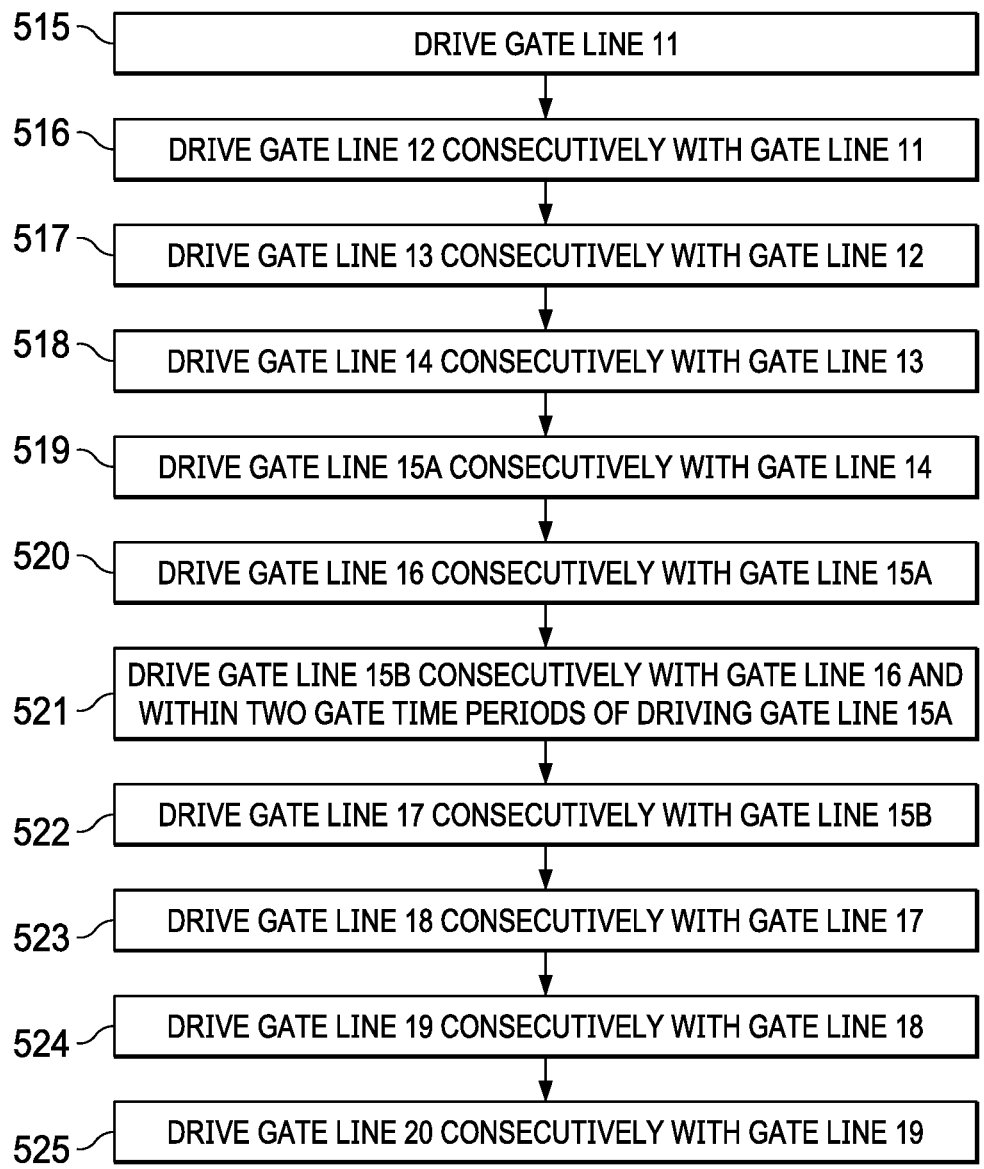
FIG. 5A3

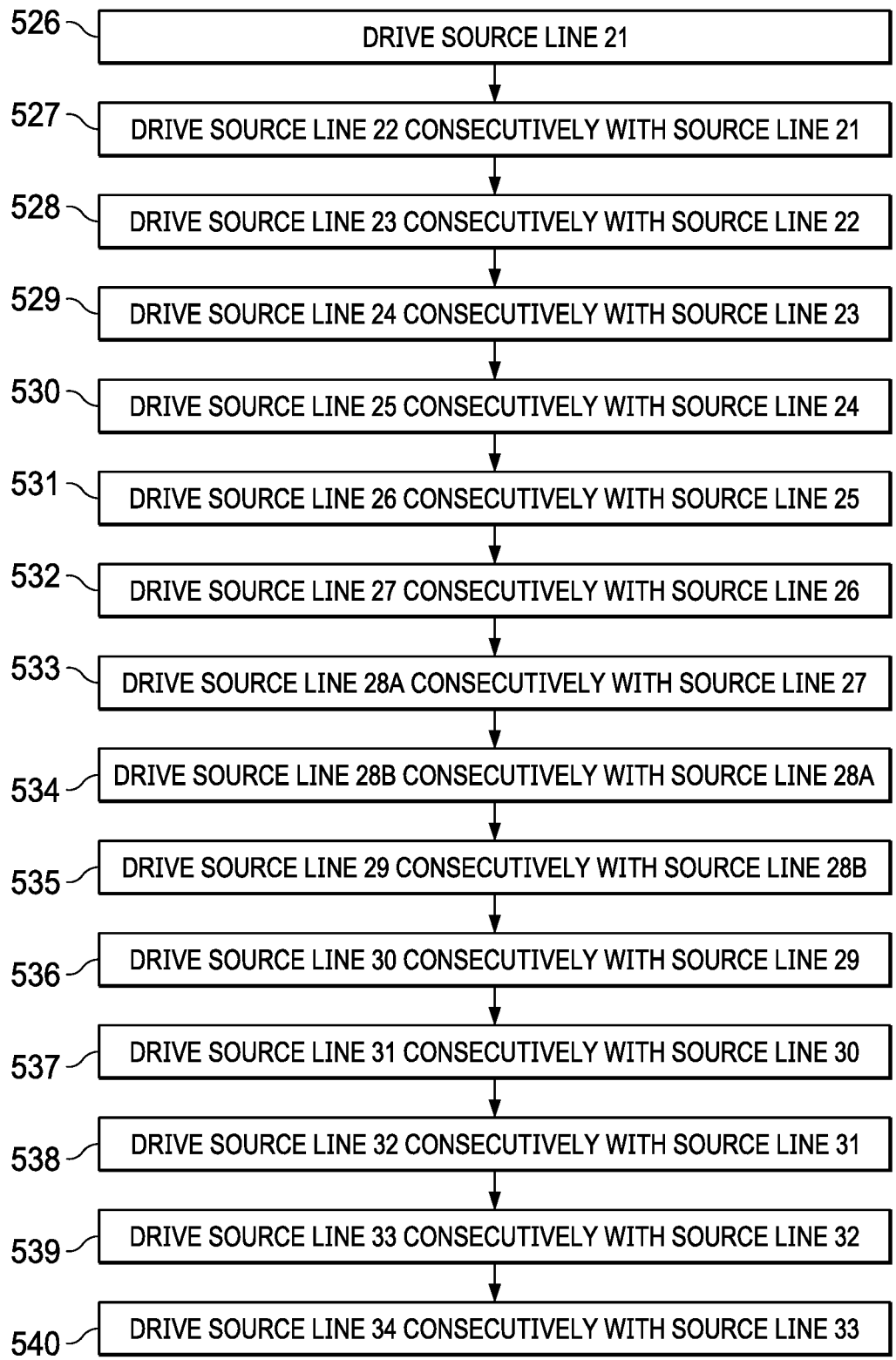
FIG. 5A4

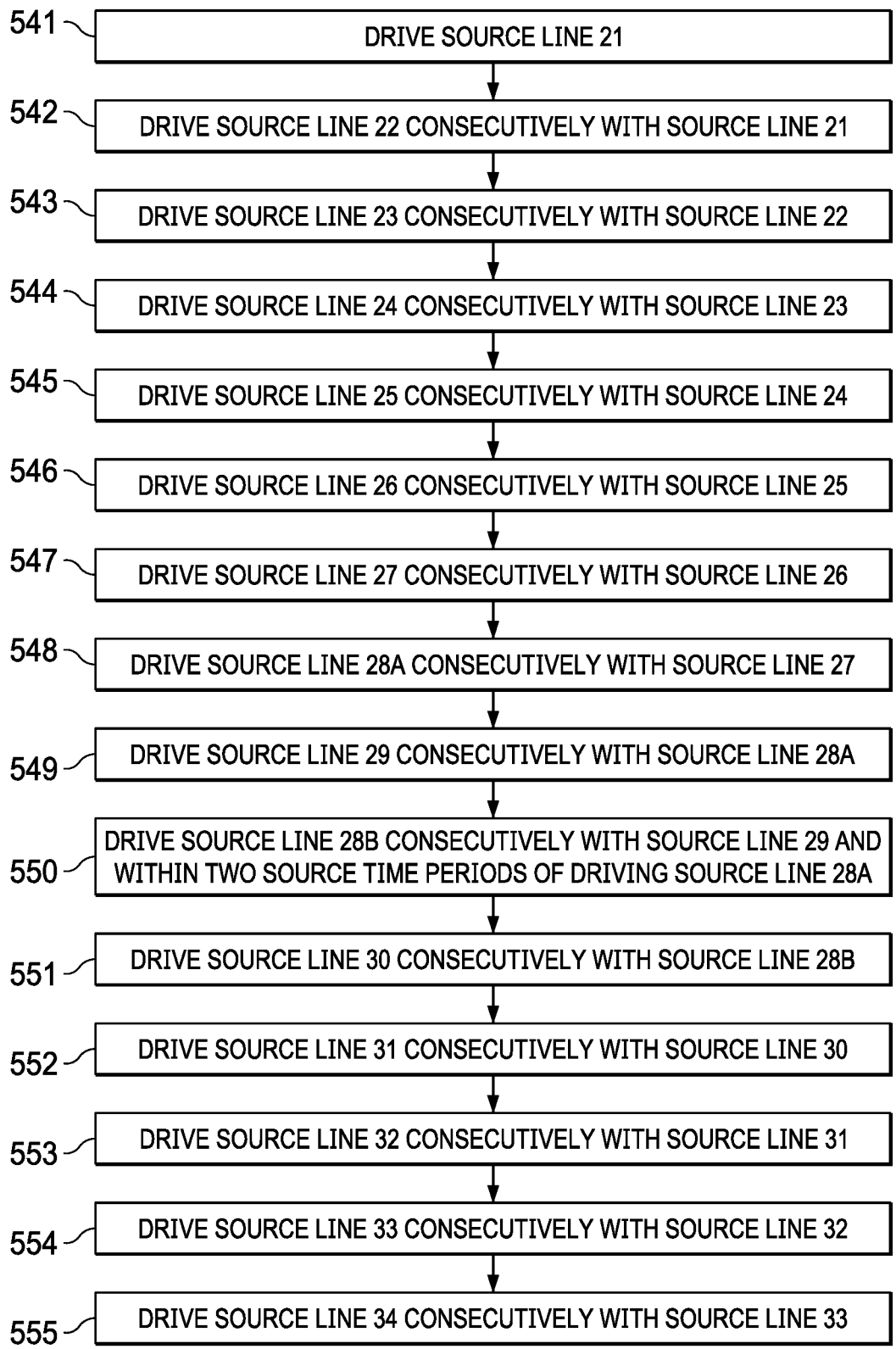
FIG. 5A5

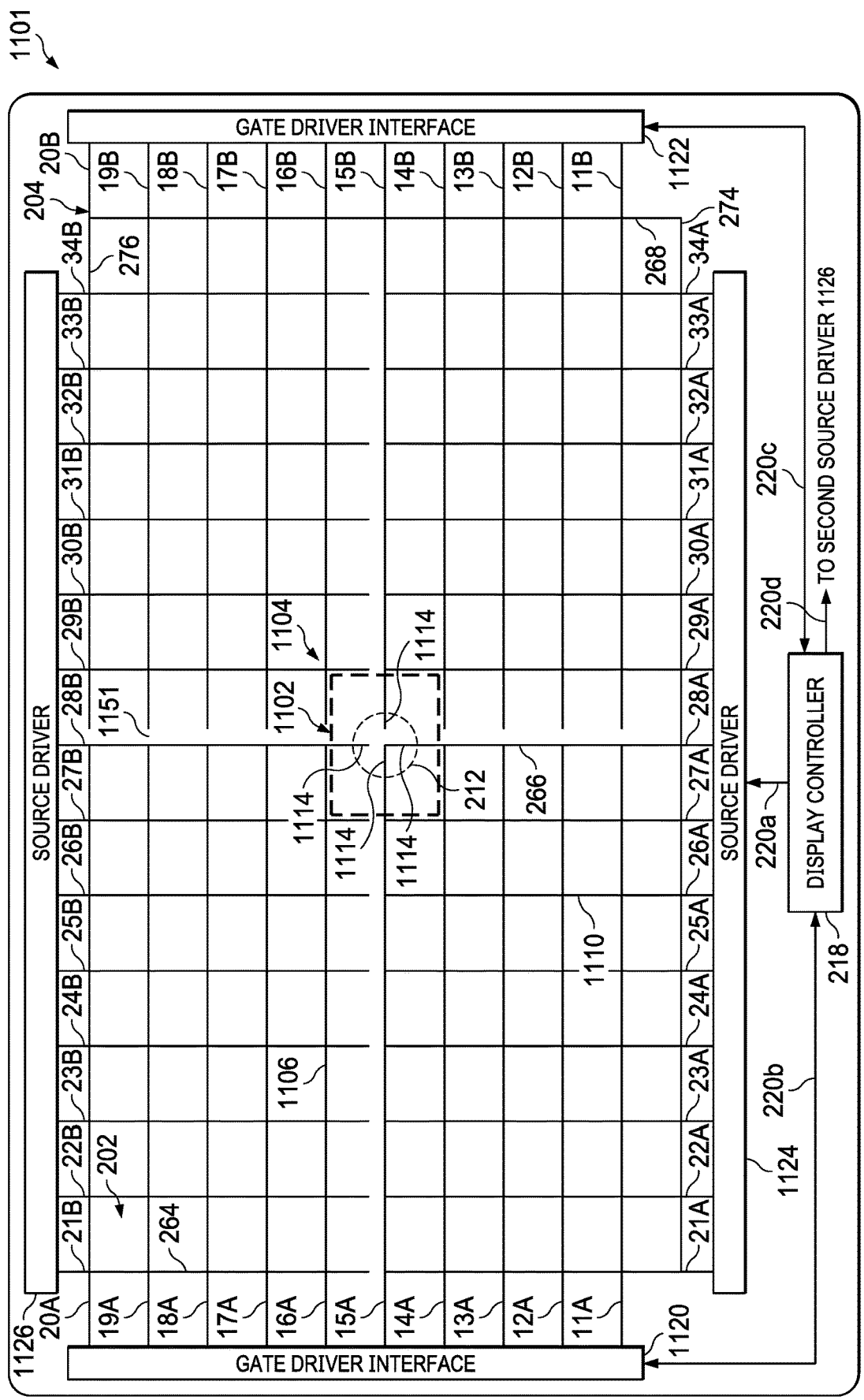
FIG. 5B1

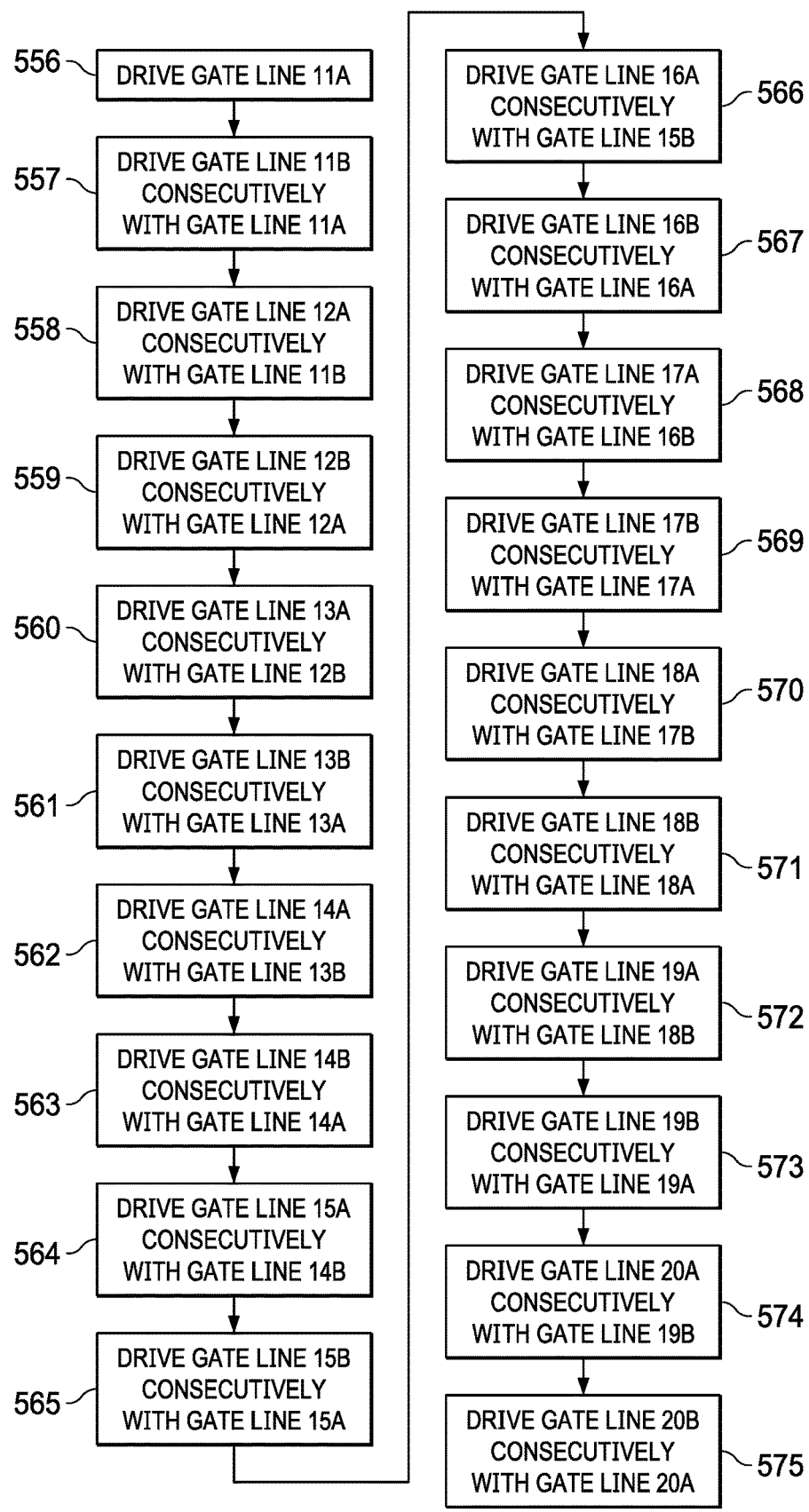
FIG. 5B2

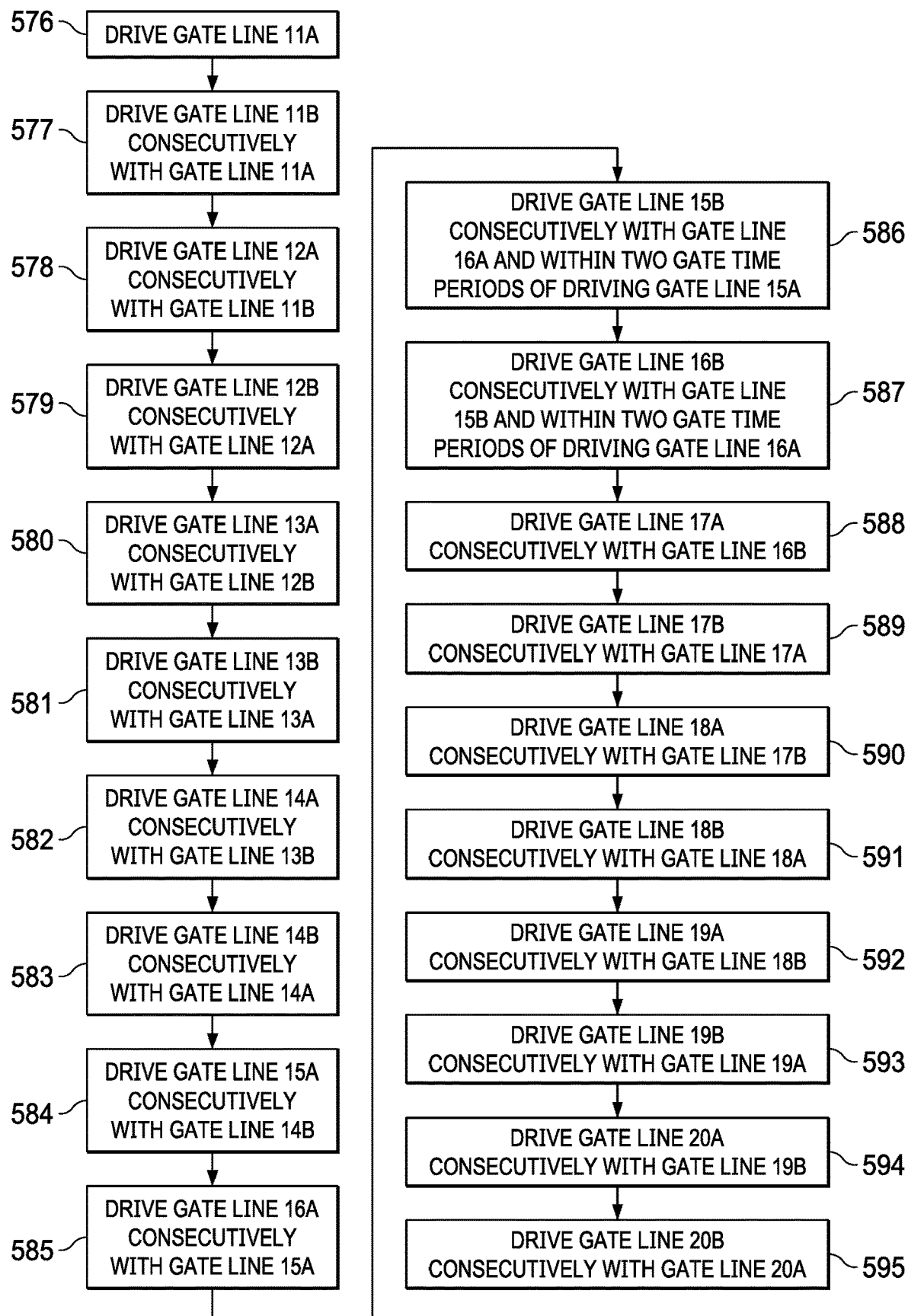
FIG. 5B3

FIG. 5B4
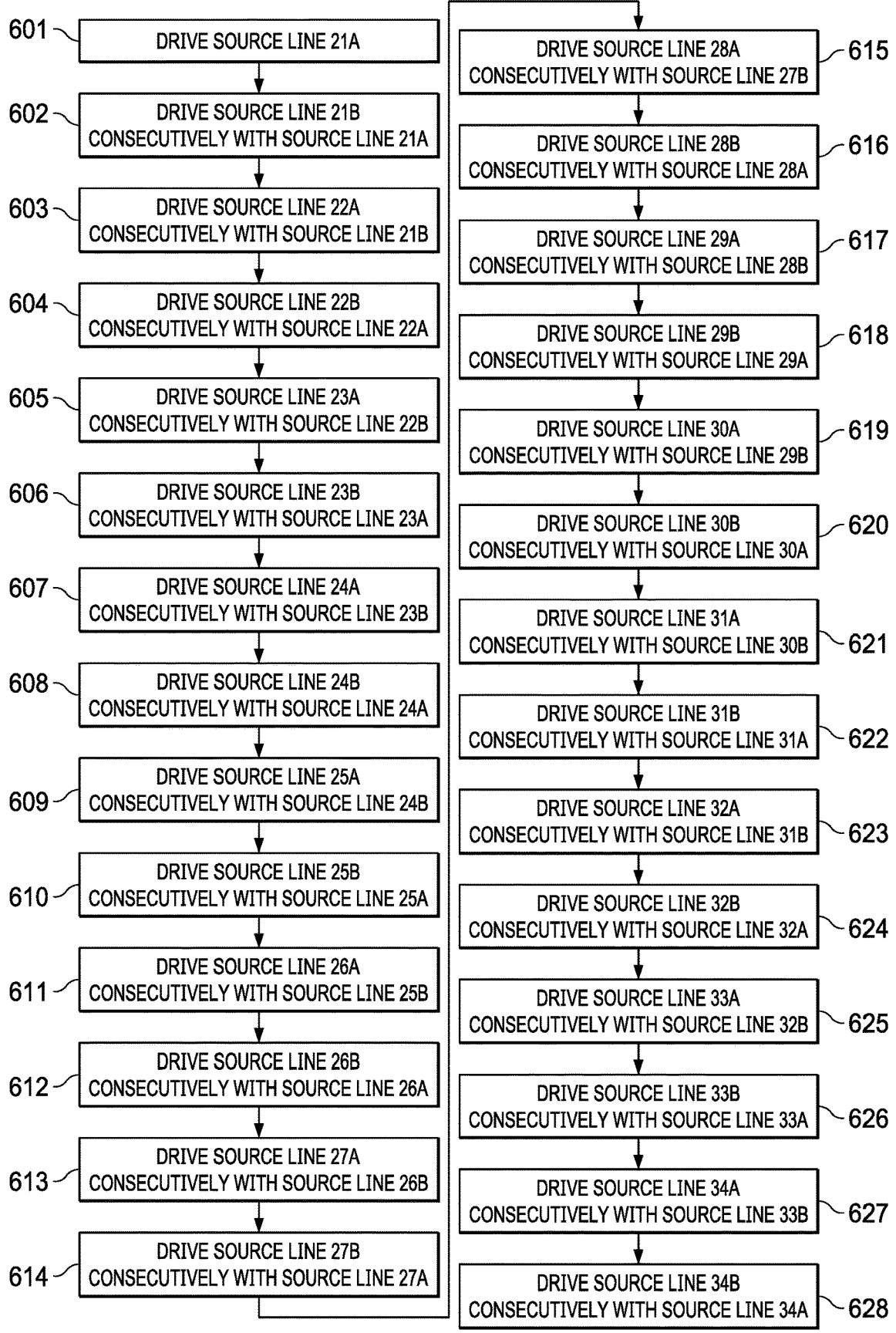

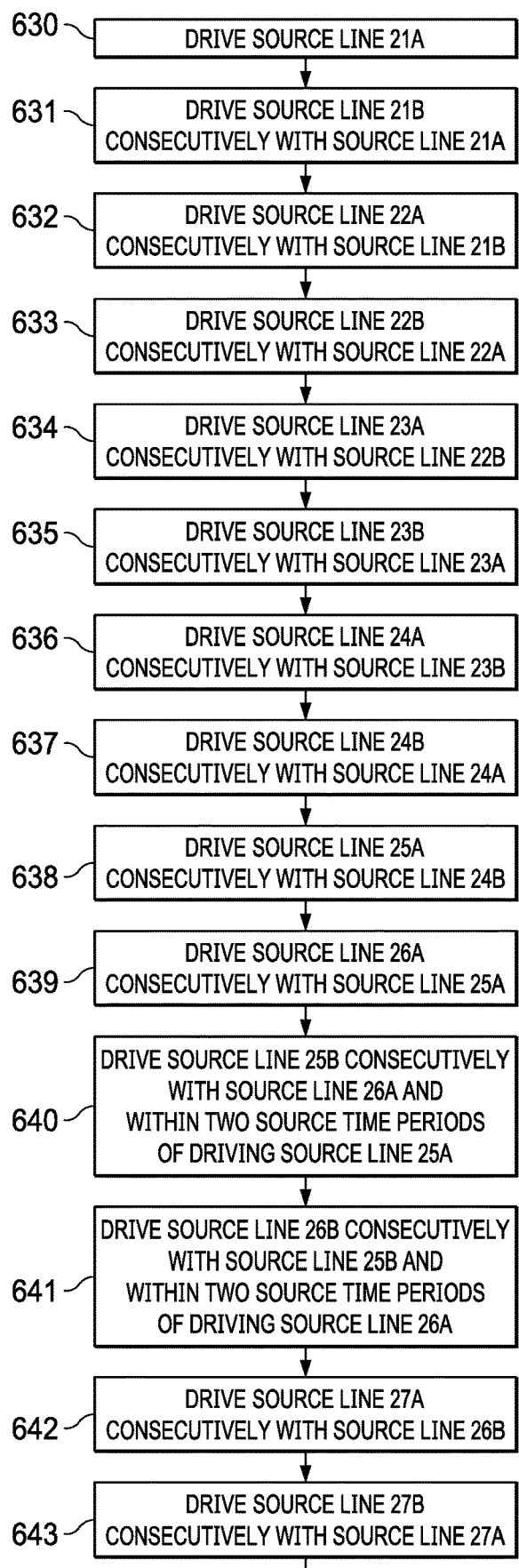
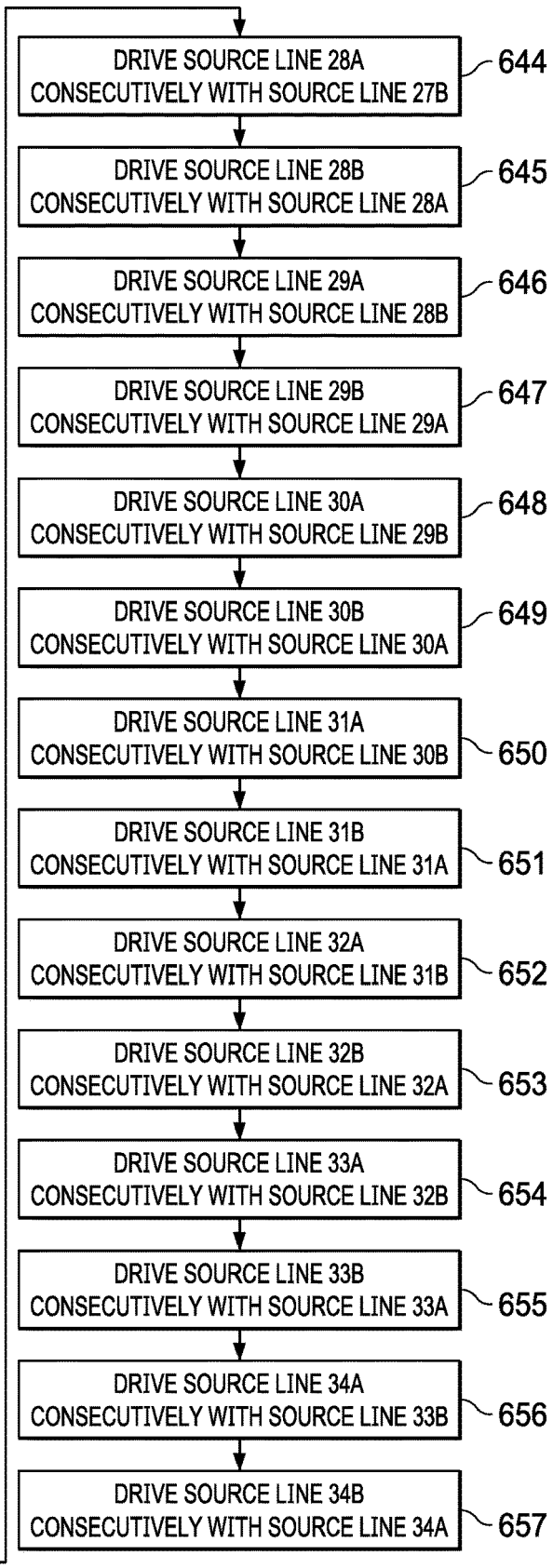
FIG. 5B5

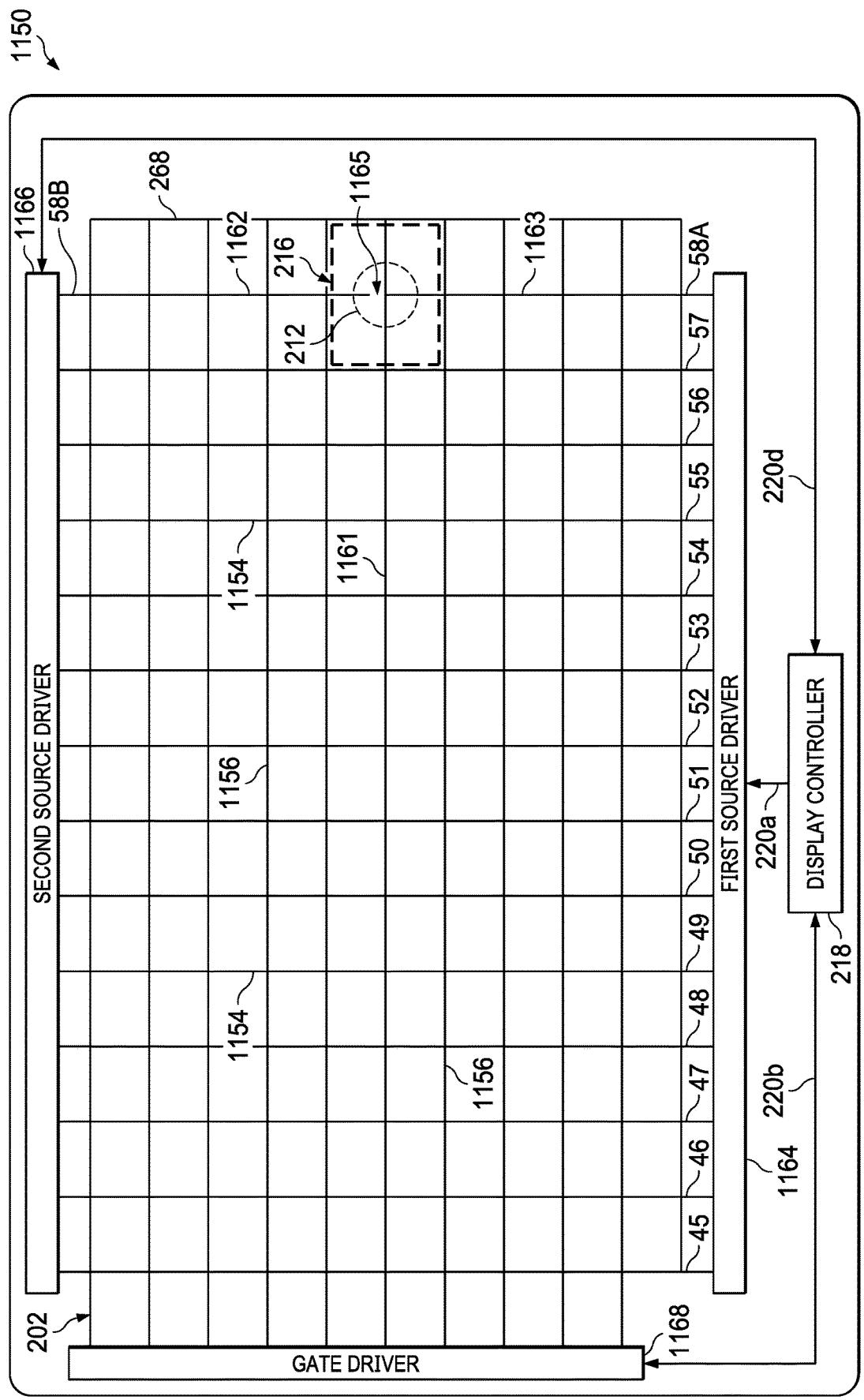
FIG. 6A1

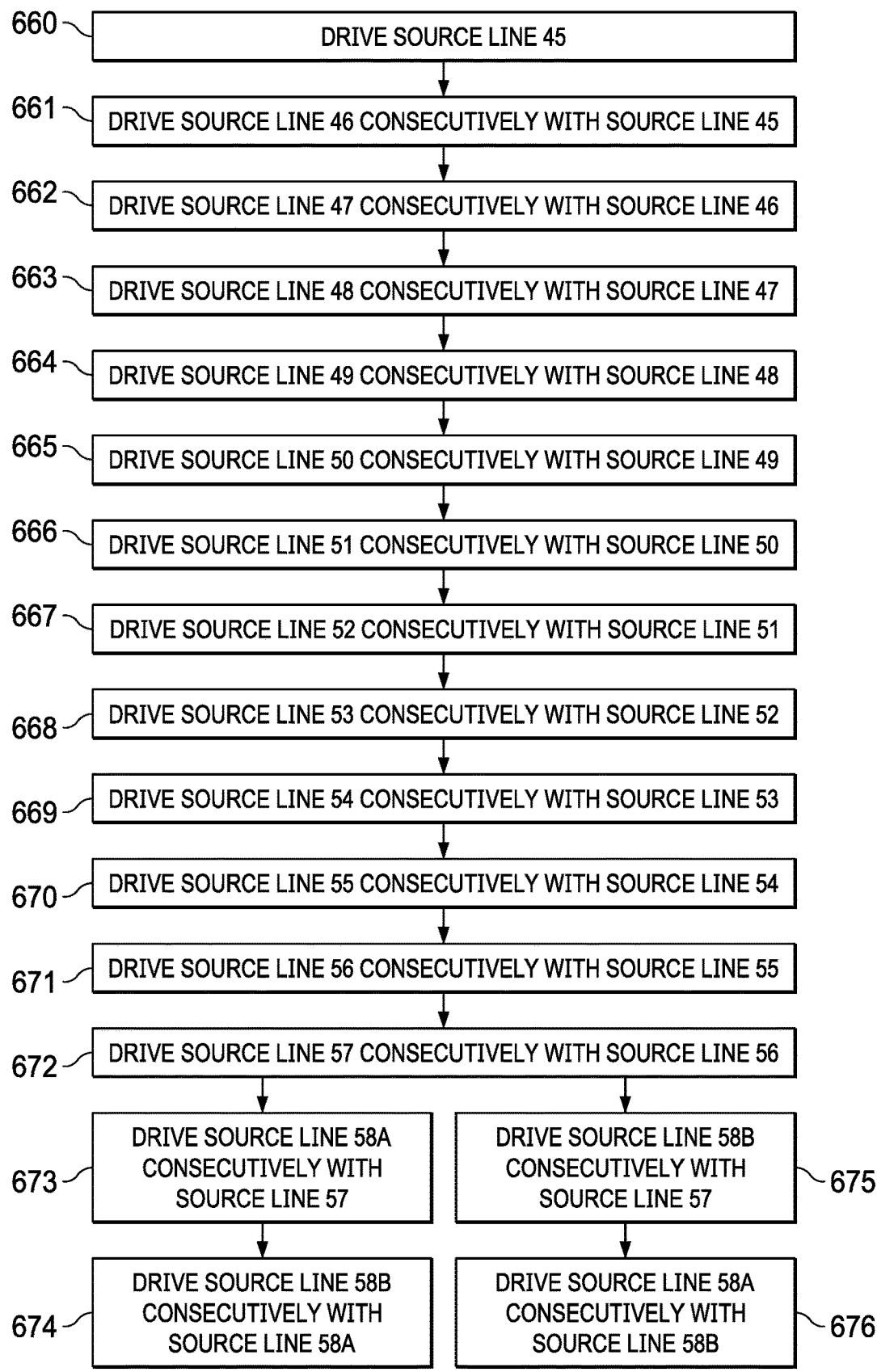
FIG. 6A2

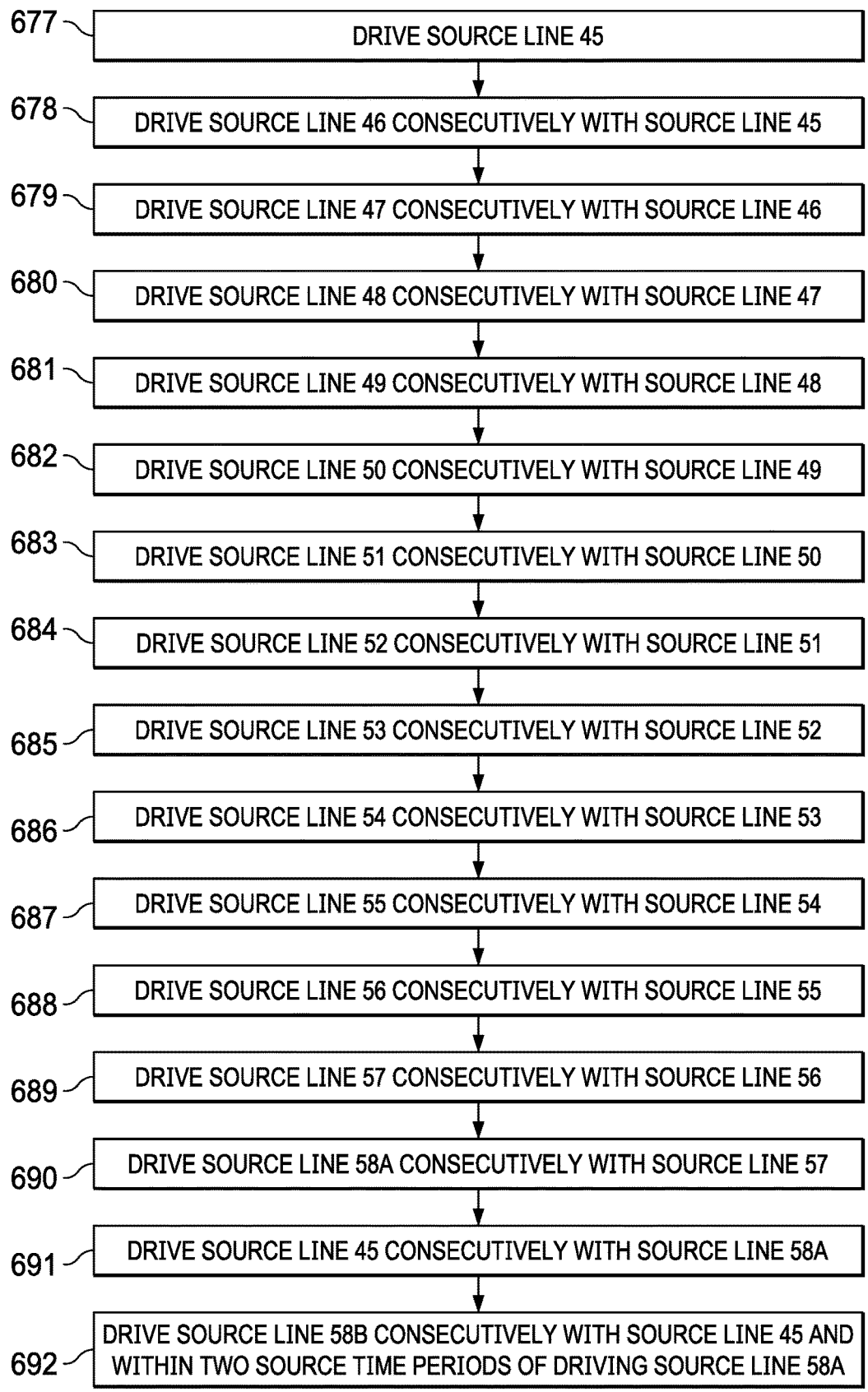
FIG. 6A3

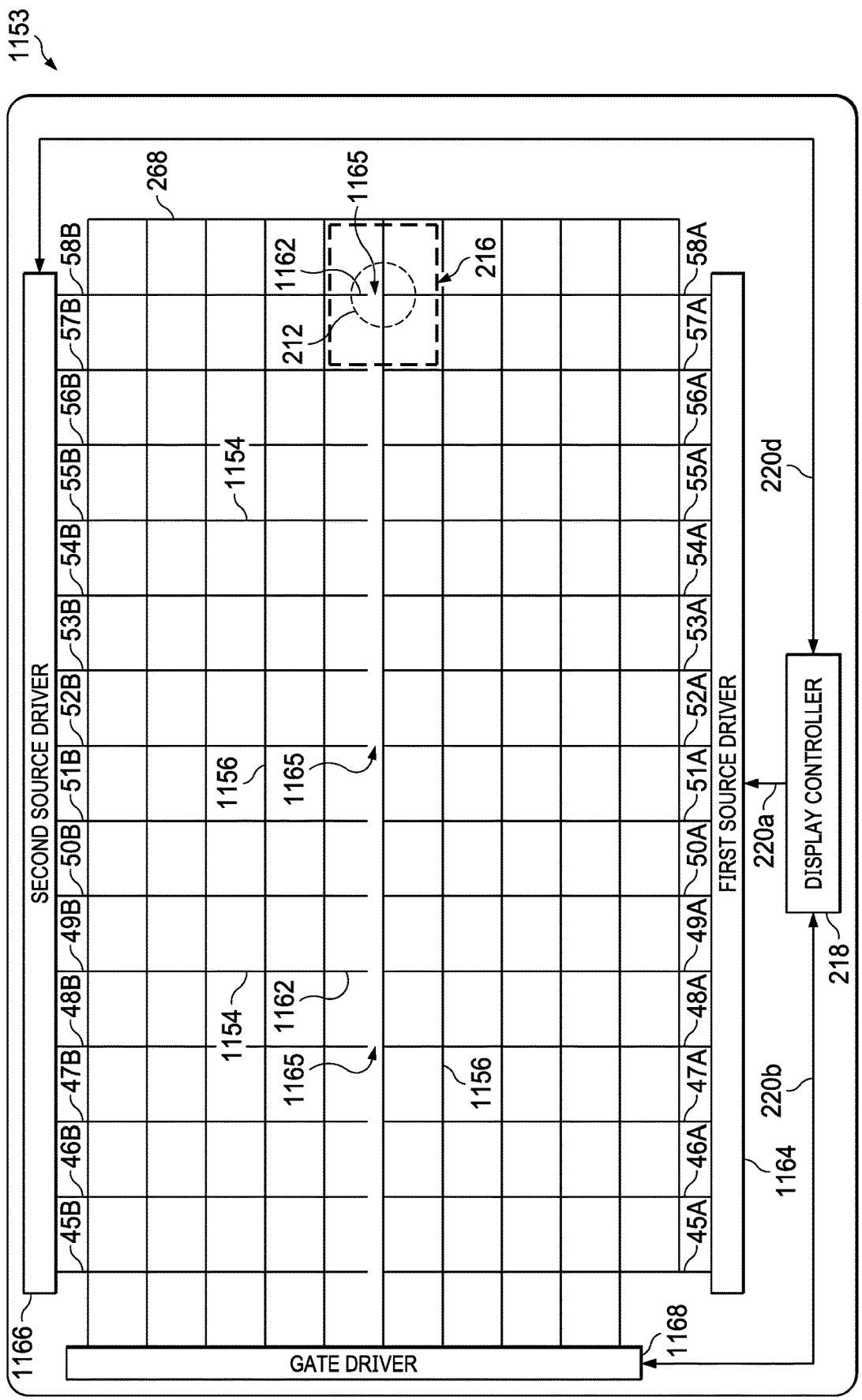
FIG. 6B1

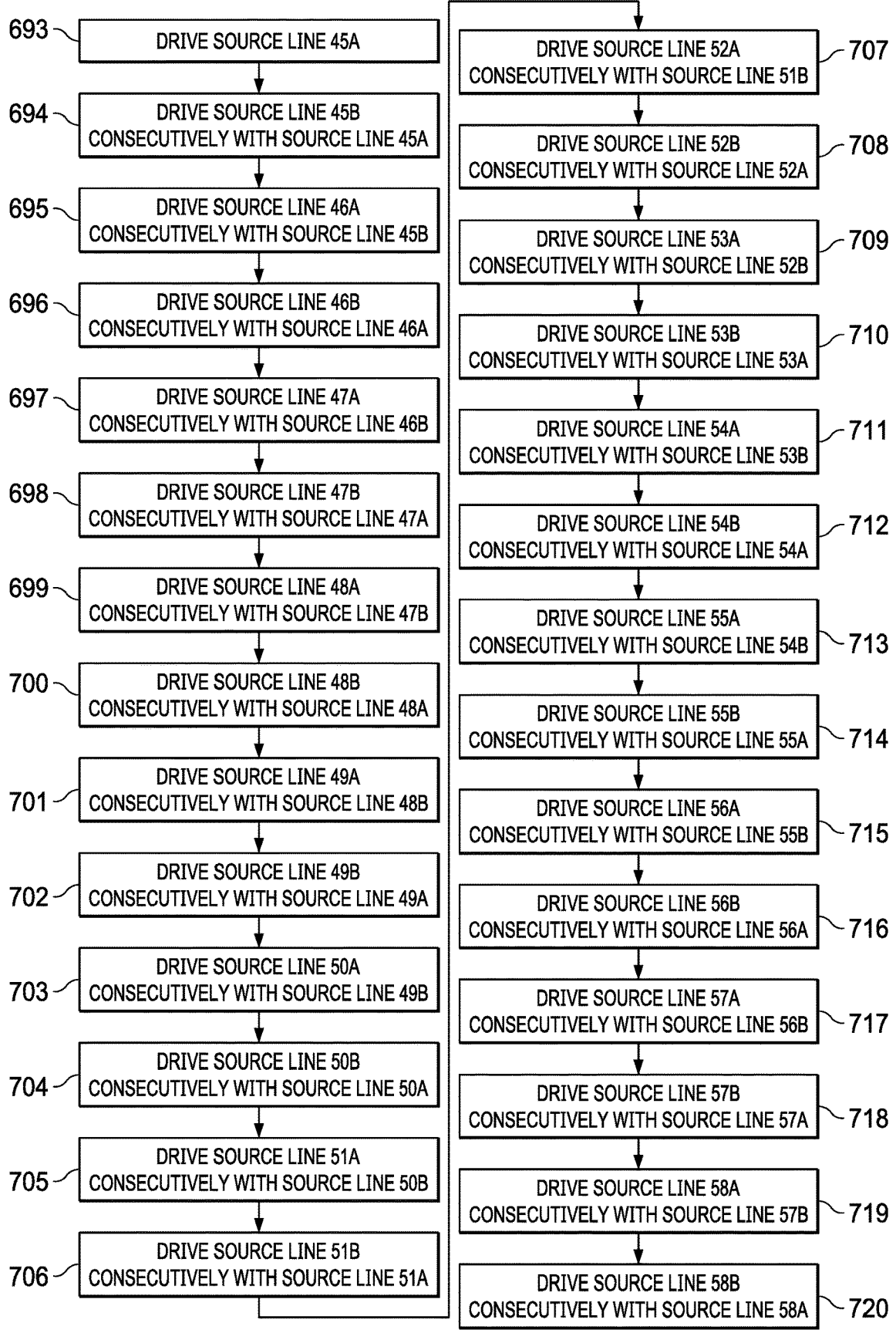
FIG. 6B2

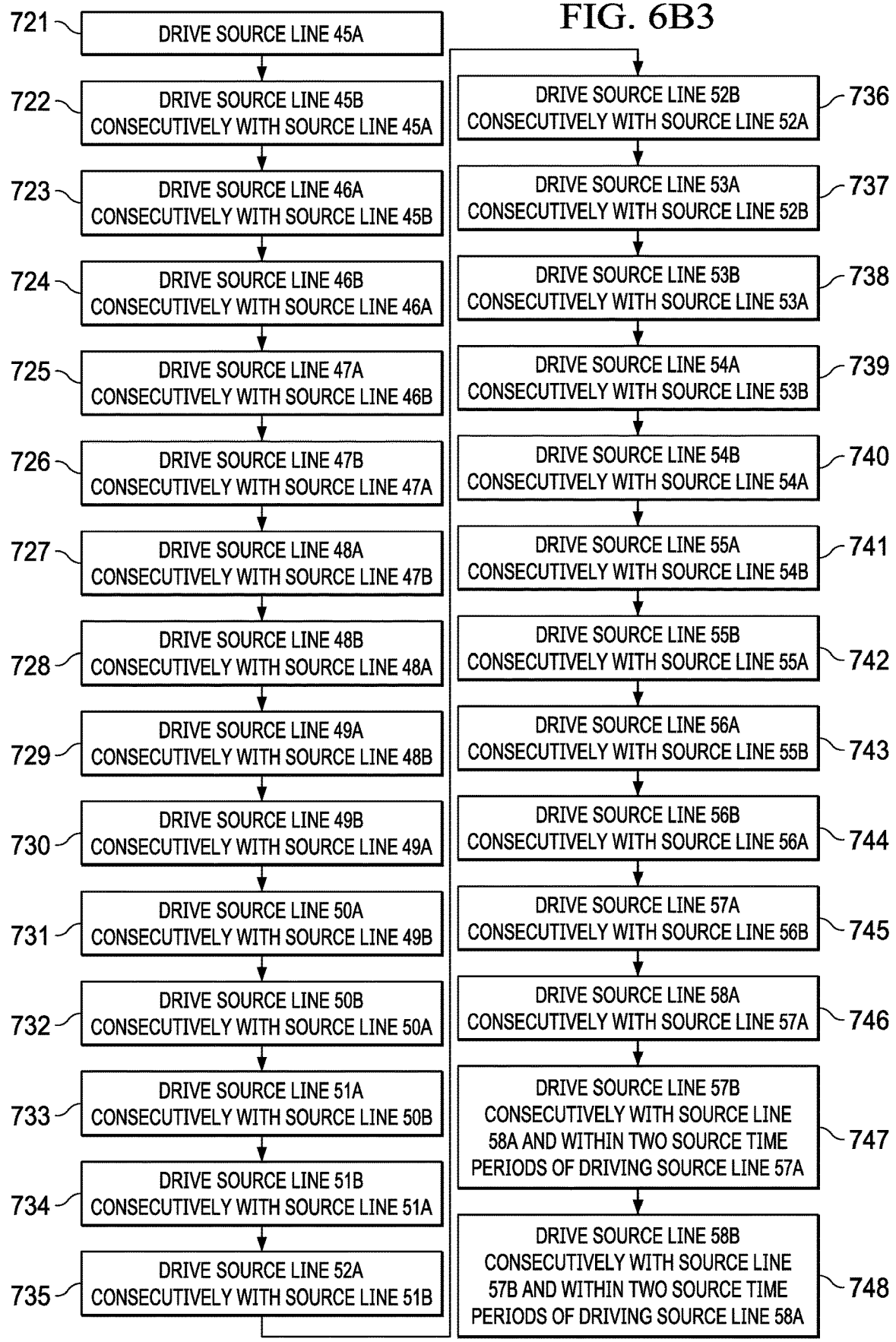
FIG. 6B3

CONTROLLERS TO DRIVE DISPLAY LINES

BACKGROUND

Electronic devices often contain displays to display graphical content, such as photographs and videos. Such electronic devices also may include cameras so that an electronic device user may, for example, participate in video meetings. In electronic devices containing both displays and cameras (e.g., notebooks, standalone computer monitors, tablets, smartphones), the camera is often positioned in a border that extends along the perimeter of the display. Other configurations include a notch provided adjacent to the display to position the camera around the display. In still other configurations, a camera is coupled to the electronic device as a peripheral device, for example, via a Universal Serial Bus (USB) connection.

BRIEF DESCRIPTION OF THE DRAWINGS

Various examples are described below referring to the following figures:

FIGS. 2A1 and 2B1 depict block diagrams of example displays disclosed herein.

FIGS. 2A2, 2A3, 2B2, and 2B3 are flow diagrams depicting the operation of displays in accordance with examples.

FIG. 3 illustrates an example circuit for controlling pixels of displays.

FIGS. 5A1 and 5B1 are block diagrams of example displays disclosed herein.

FIGS. 5A2-5A5 and 5B2-5B5 are flow diagrams depicting the operations of displays, in accordance with various examples.

FIGS. 6A1 and 6B1 are block diagrams of example displays disclosed herein.

FIGS. 6A2, 6A3, 6B2, and 6B3 are flow diagrams depicting the operations of displays, in accordance with various examples.

DETAILED DESCRIPTION

Figure 1A:
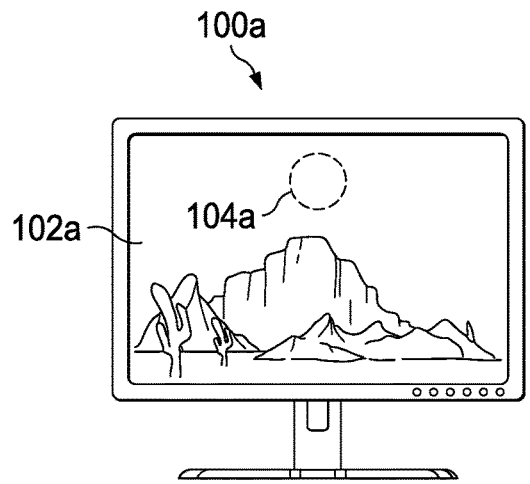
FIGS. 1A-1D depict example electronic devices that can employ example displays in accordance with the teachings disclosed herein.

The electronic devices with the various display and camera configurations described above are suboptimal for multiple reasons. For example, an electronic device containing a camera positioned in a display border results in either a smaller display area (to preserve a small form factor) or a larger form factor (to preserve a large display area). Neither of these outcomes is desirable. Further, an electronic device that includes a camera notch obscures some portion of the display. Further still, cameras coupled to electronic devices as peripherals tend to be bulky and inconvenient.

This disclosure describes various examples of electronic devices that include a camera positioned behind a display. Such an electronic device includes a display having both opaque and transparent areas. The camera is positioned behind the transparent area of the display. To facilitate transparency of the transparent area, the portions of the gate and source lines (which are used to control pixels of the display) extending through the transparent area are composed of a transparent material.

Such transparent materials, however, may have greater resistivity than the metals used to fabricate the portions of the gate and source lines extending through the opaque area of the display. As a result, the transparent materials may weaken the signals. If such weakened signals are subsequently used to control pixels in other areas of the display, the image quality may be impacted. Accordingly, to prevent such weakened signals from impacting image quality, gate and source lines that extend into a transparent area of the display terminate in or near the transparent area. In this way, a signal that is weakened after having passed through a transparent portion of a gate line or source line is not used to control other pixels in the display, thereby preserving image quality.

The electronic devices described herein also implement specific gate and source line driving patterns that improve image quality relative to electronic devices employing other gate and source line driving patterns. In an example, a display may contain multiple rows of pixels. A pixel row that extends through an opaque area (but not a transparent area) of the display may be controlled by one gate line. In contrast, a pixel row that extends through both the opaque area and the transparent area may be controlled by multiple (e.g., two) gate lines, each of which originates at one end of the display and terminates in or near the transparent area. In this context, an example gate line driving pattern may include driving a gate line that controls a full pixel row, followed by driving a next gate line that controls a full pixel row, and so forth, in a consecutive manner. For multiple gate lines that control one pixel row extending through both the opaque and transparent areas, such multiple gate lines may be driven in an alternating manner, e.g., the gate line extending across a left side of the display may be driven first, followed by the gate line extending across a right side of the display. After both gate lines of the pixel row have been driven, the gate line(s) for the next consecutive pixel row may be driven. Such patterns also may be used to drive source lines. In this way, the delay in refreshing pixels on opposing sides of the display is mitigated, thereby improving image quality relative to other line driving patterns.

These examples and others are now described in detail with reference to the drawings.

Figure 1B:
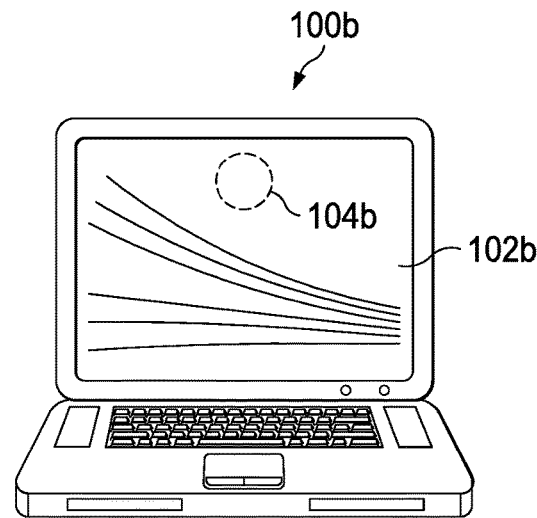
Figure 1C:
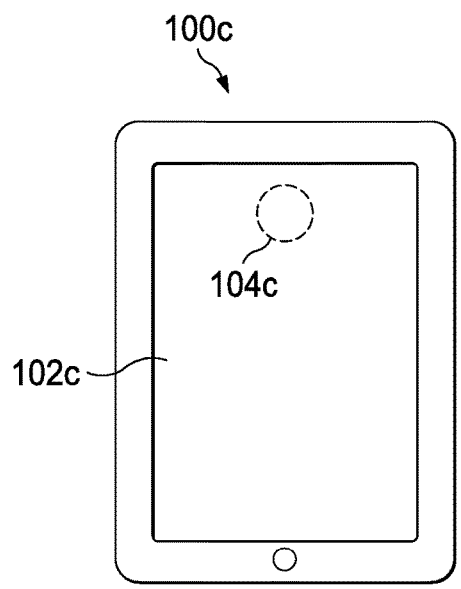
Figure 1D:
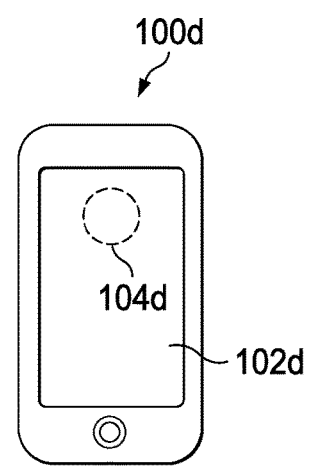

FIGS. 1A-1D illustrate example electronic devices 100a-d that can be implemented with example displays 102a-d constructed in accordance with the teachings of this disclosure. For example, the electronic device 100a of FIG. 1A is a standalone computer monitor, the electronic device 100b of FIG. 1B is a notebook computer, the electronic device 100c of FIG. 1C is a tablet, and the electronic device 100d of FIG. 1D is a mobile device, such as a smartphone. In some examples, the electronic device can include a television, a sign, and/or any other electronic device that has a display. The electronic devices 100a-d include cameras 104a-d positioned underneath (e.g., behind) transparent portions of the displays 102a-d. For example, the cameras 104a-d are positioned behind the displays 102a-d such that the displays 102a-d overlap the cameras 104a-d.

As used herein, the term "transparent" refers to a quality of a material that allows visible light to pass through, and the term "opaque" refers to a quality of a material that allows a lesser amount of visible light to pass through than the transparent material. In some examples, a transparent material enables more than 10% of light to pass through. In some examples, a transparent material enables more than 50% of light to pass through. In some examples, a transparent material enables between approximately 30% and 80% of light to pass through. In some examples, a translucent material is considered a transparent material. In some examples, an opaque material prevents more than 90% of light from passing through. Thus, in some examples, an opaque material does enable the transmission of a relatively low amount of light. In some examples, an opaque material is considered a nontransparent material.

FIG. 2A1 illustrates an example display 200 that can implement the example displays 102a-d of FIGS. 1A-1D. By way of example, the display 200 of the illustrated example includes an organic light emitting diode (OLED) display. However, in some examples, the display 200 of the illustrated example can include a light emitting diode (LED) display, and/or any other display element(s). In some examples, the display 200 of the illustrated example may include a touch-sensitive display. As used herein, the term "display" refers to a device and/or a combination of devices that are used to present information in a visual form.

The display 200 of the illustrated example includes a viewing area 202 defined by a pixel array 204. For example, the pixel array 204 can be formed by several layers of material(s), such as a cover/glass layer, a color filter layer, a display layer including light emitting diodes or organic light emitting diodes, a thin film transistor layer, an insulator layer, etc. The pixel array 204 of the illustrated example includes a plurality of pixels 206. Specifically, the pixels 206 of the pixel array 204 of the illustrated example are formed in pixel rows 208 and pixel columns 210 (e.g., tens, hundreds, thousands, or more rows and/or columns) and are activated or deactivated in a precisely timed pattern to generate a desired image in the viewing area 202.

Additionally, an electronic device containing the display 200 of the illustrated example also includes a camera 212. By way of example, the camera 212 of the illustrated example is positioned underneath (e.g., behind) the display 200. For example, the camera 212 of the illustrated example is positioned between the display 200 (e.g., a substrate of the display 200) and a housing of an electronic device (e.g., the electronic devices 100a-d of FIGS. 1A-1D). In other words, the camera 212 is positioned to capture an image through the display 200.

To enable the camera 212 to capture an image through the display 200, the display 200 of the illustrated example includes an opaque area 214 (e.g., an area that has opaque or non-transparent characteristic(s)) and a transparent area 216 (e.g., an area that has substantially transparent or translucent characteristic(s) and represented by a dashed boundary line in FIG. 2A1). The transparent area 216 is disposed above (e.g., in front of) and/or overlaps the camera 212 to allow light to pass from outside of the display 200 (e.g., an upper or outer surface of the display 200) to the camera 212 to enable the camera 212 to record or capture an image(s) through the display 200. Accordingly, the camera 212 is said to be aligned with the transparent area 216 of the display 200.

To present an image on the viewing area 202, the display 200 of the illustrated example includes a display controller 218. The display controller 218 of the illustrated example communicates or controls the pixels 206 to present an image on the viewing area 202. The display controller 218 generates signals 220 to operate the respective pixels 206.

To communicate signals 220a to (e.g., to activate/deactivate) the pixels 206 of the pixel array 204, the display 200 of the illustrated example includes a set of source lines 222. To communicate signals 220b to (e.g., activate/deactivate) the pixels 206, the display 200 of the illustrated example includes a set of gate lines 224. The set of gate lines 224 may be used to communicate signals 220c to (e.g., activate/deactivate) the pixels 206. For example, some of the gate lines in the set of gate lines 224 may be used to communicate signals 220b to the pixels 206, and other gate lines in the set of gate lines 224 may be used to communicate signals 220c to the pixels 206. The source lines 222 of the illustrated example are communicatively coupled to the display controller 218 via a source driver interface 228, and the set of gate lines 224 are communicatively coupled to the display controller 218 via a gate driver interface 230 and/or a gate driver interface 232.

The display 200, via the signals 220 from the display controller 218, can present an image by controlling the pixels 206 in the opaque area 214 of the viewing area 202 and the transparent area 216 of the viewing area 202. Thus, although the display 200 of the illustrated example includes the opaque area 214 and the transparent area 216, the opaque area 214 and the transparent area 216 provide a seamless viewing area when presenting an image. In other words, an image can be presented on both the opaque area 214 and the transparent area 216 without affecting (e.g., degrading a quality of) an image presented across the opaque area 214 and the transparent area 216 of the viewing area 202. Thus, an image can be presented across the viewing area 202 of the display 200 including the pixels 206 corresponding to the transparent area 216.

The set of source lines 222 of the illustrated example includes a source line 234 and a source line 236. The set of gate lines 224 of the illustrated example includes a gate line 238 and a gate line 240. Additionally, the source line 234 of the illustrated example includes a portion 246 composed of a first material and a portion 248 composed of a second material different than the first material. Likewise, the gate line 238 of the illustrated example includes a portion 250 composed of the first material and a portion 252 composed of the second material. Likewise, a gate line 242 of the illustrated example includes a portion 254 composed of the first material and a portion 256 composed of the second material. The source line 236 and the gate line 240 of the illustrated example are composed of the first material.

The first material of the illustrated example can be an opaque or non-transparent conductor composed of a metallic material such as, for example, copper, aluminum, titanium, silver, molybdenum, composition or stacked layers of these materials, and/or any other suitable conductive material(s) having opaque characteristic(s). The second material of the illustrated example can be a transparent conductor composed of, for example, indium tin oxide (ITO), indium zinc oxide (IZO), indium gallium zinc oxide (IGZO) and/or any other conductive material(s) having transparent characteristic(s). To provide the opaque area 214, the portions 246, 250, 254 of the respective source line 234, the gate line 238, and the gate line 242 are composed of the first material (e.g., an opaque conductor). Additionally, to provide the opaque area 214, the source line 236 and the gate line 240 are composed of the first material. To provide the transparent area 216, the portion 248 of the source line 234, the portion 252 of the gate line 238, and the portion 256 of the gate line 242 of the illustrated example are composed of the second material (e.g., a transparent conductor). For example, the portions 246, 250, 254 of the respective source line 234, the gate line 238, and the gate line 242 and the source line 236 and the gate line 240 defining the opaque area 214 have a first resistivity characteristic or property. The portion 248 of the source line 234, the portion 252 of the gate line 238, and the portion 256 of the gate line 242 of the illustrated example have a second resistivity characteristic or property. In examples, the first resistivity characteristic is different than (e.g., less than) the second resistivity characteristic.

Additionally, the transparent conductive material(s) forming the portions 248, 252, 256 of the respective source line 234, the gate line 238, and the gate line 242 of the illustrated example have relatively high resistive characteristic(s). To this end, to avoid signal degradation of the signals 220 provided by the display controller 218 to the pixels 206 in the transparent area 216, the gate line 238 is electrically isolated from the gate line 242 by a gap (e.g., a discontinuity or space) 251. To this end, the gate line 238 extends from an edge (or end) 264 (e.g., a left side or edge in the orientation of FIG. 2A1) of the display 200 to the transparent area 216, and the gate line 242 of the illustrated example extends from an edge (or end) 268 (e.g., a right side edge in the orientation of FIG. 2A1) of the display 200 to the transparent area 216. Additionally, the source lines 222 extend between an edge (or end) 274 (e.g., a bottom edge in the orientation of FIG. 2A1) of the display 200 and an edge (or end) 276 (e.g., an upper edge in the orientation of FIG. 2A1) of the display 200 opposite the edge 274. In examples, the portion 248 of the source line 234 defines a terminating end 278 of the source line 234. Thus, the portion 248 of the source line 234 may degrade the signals 220, but because the transparent area 216 is positioned at the edge 276, the degraded signals are not subsequently used to control any pixels 206 beyond the transparent area 216. The gap 251 reduces degradation and/or interference with the signals 220 that can otherwise occur if the transparent conductors of the gate line 238 and the gate line 242 are not separated by the gap 251 (i.e., if the gate lines 238, 242 were coupled and formed as a unitary gate line).

To generate or present an image on the display 200 or to control an image presented on the display 200, the set of source lines 222 and the set of gate lines 224 activate and/or deactivate the pixels 206 of the viewing area 202. For example, the display controller 218 communicates a signal 220a1 to a pixel 206a via a source line 222a and a signal 220b1 to a gate line 224a of the set of gate lines 224 to control a gate of the pixel 206a. Likewise, the display controller 218 communicates a signal 220a2 to a pixel 206b via a source line 222b and a signal 220c1 to a gate line 226a to control a gate of the pixel 206b.

FIG. 2A2 depicts an example operation of the display 200 of FIG. 2A1. More specifically, FIG. 2A2 depicts an example driving pattern for the display 200 of FIG. 2A1 in which a pair of gate lines positioned in a same row of the display 200 are driven consecutively. The gate lines of the display 200 are labeled 1-8, 9A-9B, and 10 to facilitate the description of the driving pattern of FIG. 2A2. Accordingly, FIG. 2A2 is now described in tandem with FIG. 2A1. The driving pattern of FIG. 2A2 includes the display controller 218 driving the gate line 1 first (280). The display controller 218 may use either the gate driver interface 230 or the gate driver interface 232 to drive the gate line 1. Stated another way, the gate line 1 may be driven from left to right (e.g., by a signal issued by the gate driver interface 230) or from right to left (e.g., by a signal issued by the gate driver interface 232). The gate line 1 controls the pixel row 208 that abuts the edge 274.

After the display controller 218 drives gate line 1, the display controller 218 drives gate line 2 consecutively with gate line 1 (281). The term "consecutively," as used in the context of driving gate lines, means that two gate lines are driven, one after the other, without a different gate line being driven in between. For example, if gate line 2 is driven consecutively with gate line 1, then gate line 2 is driven before or after gate line 1 without another gate line being driven in between gate lines 2 and 1. The term "consecutively" applies in the same way to the driving of source lines, meaning that two source lines are consecutively driven if they are driven one after the other without a different source line being driven in between. Gate line 2 controls the pixel row 208 positioned between gate lines 1 and 2. The pixel row 208 controlled by gate line 2 is consecutive with the pixel row 208 controlled by gate line 1, meaning that these two pixel rows have no other pixel rows positioned between them. The term "consecutive" can be applied to pixel columns, meaning that if pixel columns 1 and 2 are consecutive with each other, then no other pixel columns are positioned between pixel columns 1 and 2.

After the display controller 218 drives gate line 2, the display controller 218 drives gate line 3 consecutively with gate line 2 (282); gate line 4 consecutively with gate line 3 (283); gate line 5 consecutively with gate line 4 (284); gate line 6 consecutively with gate line 5 (285); gate line 7 consecutively with gate line 6 (286); and gate line 8 consecutively with gate line 7 (287). These gate lines may be driven using the gate driver interface 230, the gate driver interface 232, or a combination thereof. After the display controller 218 drives the gate line 8, the display controller 218 drives the gate lines 9A and 9B consecutively. Thus, for example, the display controller 218 may drive the gate line 8, then gate line 9A consecutively with gate line 8 (288), then gate line 9B consecutively with gate line 9A (289), and then gate line 10 consecutively with gate line 9B (290). In examples, the display controller 218 may drive the gate line 8, then gate line 9B consecutively with gate line 8 (291), then gate line 9A consecutively with gate line 9B (292), and then gate line 10 consecutively with gate line 9A (293). In some examples, the process of FIG. 2A2 may be performed in reverse (e.g., by driving gate line 10, then gate line 9B consecutively with gate line 10, then gate line 9A consecutively with gate line 9B, then gate line 8 consecutively with gate line 9A, and so on; in other examples, by driving gate line 10, then gate line 9A consecutively with gate line 10, then gate line 9B consecutively with gate line 9A, then gate line 8 consecutively with gate line 9B, and so on). By driving the gate lines 9A and 9B consecutively, the left and right sides of the display 200 at the gate lines 9A and 9B are refreshed at nearly the same time, thereby reducing refresh delay between the left and right sides and improving image quality. The greater the number of gate lines extending through the transparent area 216, the greater the beneficial effect of this driving pattern.

Figure 3:
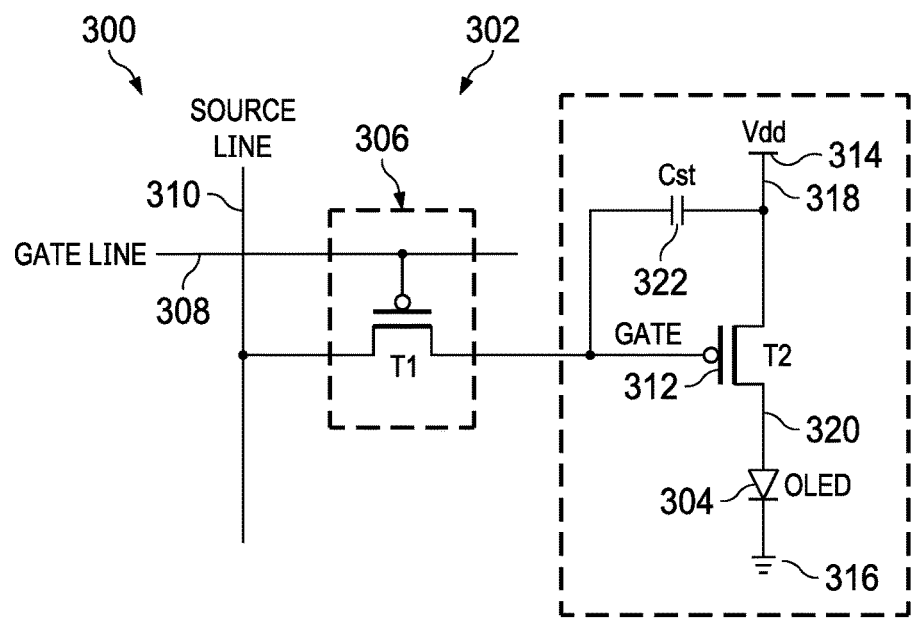

In some examples, the gate lines 9A and 9B may be driven non-consecutively, but within a specified amount of time of each other, such that the left and right sides of the display 200 at the gate lines 9A and 9B are still refreshed at nearly the same time. In this way, the benefits of reduced refresh delays between the left and right sides of the display are realized without the gate lines 9A and 9B being driven consecutively. FIG. 2A3 depicts an example driving pattern in which a pair of gate lines positioned in a same row of the display 200 are driven non-consecutively but within a predetermined time of each other. Specifically, the gate lines 1-8 are driven consecutively (280-287), followed by gate line 9A being driven consecutively with gate line 8 (294), gate line 10 driven consecutively with gate line 9A (295), and then gate line 9B driven consecutively with gate line 10 (296). In this driving pattern, the gate lines 9A and 9B are not driven consecutively, but the gate lines 9A and 9B are driven within two gate time periods of each other. A gate time period, as used herein, is the time to refresh one gate line. For example, in a 60 Hz display having 2160 gate lines, one gate time period is 1/(60*2160), or 7.7 microseconds. Likewise, a source time period, as used herein, is the time to refresh one source line. For example, in a 60 Hz display having 2160 source lines, one source time period is 1/(60*2160), or 7.7 microseconds. As a result, the above-mentioned benefits in image quality are still realized. In examples, the driving pattern of FIG. 2A3 is reversed (e.g., the gate line 9B is driven, followed by gate line 10, then gate line 9A after gate line 10 and within two gate time periods of driving gate line 9B, then gate line 8, and so on; in other examples, the gate line 9A is driven, followed by gate line 10, then gate line 9B after gate line 10 and within two gate time periods of driving gate line 9A, then gate line 8, and so on).

FIG. 2B1 depicts a display 201 that is virtually the same as the display 200 of FIG. 2A1. However, the display 201 differs from the display 200 in that instead of one gap 251 positioned between the gate lines 238, 242, the display 201 includes a plurality of gaps 251 positioned between the sets of gate lines 224 and 226. Accordingly, the display 201 includes two sets of gate lines: a set of gate lines 224, positioned on the left side of the display 201, and a set of gate lines 226, positioned on the right side of the display 201, with the sets of gate lines 224, 226 separated by the gaps 251. The display controller 218 drives the set of source lines 222 as described above in the context of the display 200; the display controller 218 drives the set of gate lines 224 using the gate driver interface 230; and the display controller 218 drives the set of gate lines 226 using the gate driver interface 232. In examples, when the gate lines are being driven consecutively, the source lines are not driven consecutively, and when the source lines are being driven consecutively, the gate lines are not driven consecutively.

FIG. 2B2 depicts an example operation of the display 201 of FIG. 2B1. More specifically, FIG. 2B2 depicts an example driving pattern for the display 201 of FIG. 2B1 in which multiple pairs of gate lines are driven consecutively. The gate lines of the display 201 are labeled 1A-10A and 1B-10B to facilitate the description of the driving pattern of FIG. 2B2, with the display controller 218 driving the set of gate lines 224 via the gate driver interface 230 and the set of gate lines 226 via the gate driver interface 232. Accordingly, FIG. 2B2 is now described in tandem with FIG. 2B1. The driving pattern of FIG. 2B2 includes the display controller 218 driving the gate line 1A (2000), followed by the gate line 1B consecutively with gate line 1A (2001). The display controller 218 subsequently drives gate line 2A consecutively with gate line 1B (2002); gate line 2B consecutively with gate line 2A (2003); gate line 3A consecutively with gate line 2B (2004); gate line 3B consecutively with gate line 3A (2005); gate line 4A consecutively with gate line 3B (2006); gate line 4B consecutively with gate line 4A (2007); gate line 5A consecutively with gate line 4B (2008); gate line 5B consecutively with gate line 5A (2009); gate line 6A consecutively with gate line 5B (2010); gate line 6B consecutively with gate line 6A (2011); gate line 7A consecutively with gate line 6B (2012); gate line 7B consecutively with gate line 7A (2013); gate line 8A consecutively with gate line 7B (2014); gate line 8B consecutively with gate line 8A (2015); gate line 9A consecutively with gate line 8B (2016); gate line 9B consecutively with gate line 9A (2017); gate line 10A consecutively with gate line 9B (2018); and gate line 10B consecutively with gate line 10A (2019). In examples, the display controller 218 drives the gate lines starting with gate line 1B, followed by gate line 1A consecutive with gate line 1B; gate line 2B consecutively with gate line 1A, and so forth. In examples, the display controller 218 drives the gate lines in reverse of the order depicted in FIG. 2B2, starting with gate line 10B, then gate line 10A, then gate line 9B, and so on. In some examples, the display controller 218 drives gate line 10A, then gate line 10B, then gate line 9B, and so on.

The driving pattern of FIG. 2B2 provides the benefits described above with respect to FIG. 2A2 because the left and right sides of the display 201 are refreshed at approximately the same time. In examples, the driving pattern of FIG. 2B2 may be modified as shown in FIG. 2B3, in which some of the gate lines corresponding to a common pixel row (e.g., gate lines 5A, 5B) are not driven consecutively, but are still driven within a predetermined time frame. For example, the driving pattern of FIG. 2B3 may be the same as that of FIG. 2B2, except that the display controller 218 may drive the gate lines 5A and 5B non-consecutively, such that gate line 5A is driven consecutively after gate line 4B (2008); gate line 6A is driven consecutively after gate line 5A (2021); gate line 5B is driven consecutively after gate line 6A and within two gate time periods of driving gate line 5A (2022); gate line 6B is driven consecutively after gate line 5B and within two gate time periods of driving gate line 6A (2023); gate line 7A is driven consecutively after gate line 6B (2012); gate line 7B is driven consecutively after gate line 7A (2013), and so forth. This variation of the driving pattern of FIG. 2B2 includes the gate lines 5A and 5B being driven non-consecutively and gate lines 6A and 6B being driven non-consecutively, but the gate lines 5A and 5B being driven within a predetermined time frame of each other, and the gate lines 6A and 6B being driven within a predetermined time frame of each other. In this way, the improved image quality obtained by driving the gate lines controlling one pixel row consecutively are realized without actually driving those gate lines consecutively. Such variations to the driving patterns of both FIGS. 2A2 and 2B2 are contemplated and included in the scope of this disclosure. In examples, the order of operation in FIG. 2B3 may be reversed (e.g., driving gate line 10B, then gate line 10A, then gate line 9B, and so on).

FIG. 3 is a schematic diagram of an example pixel 300 of the displays 200, 201 described above. It is also representative of pixels in other displays described below. The pixel 300 of the illustrated example can implement the pixels 206 of FIGS. 2A1 and 2B1. By way of example, the pixel 300 of the illustrated example is an OLED sub-pixel. A circuit 302 activates and/or deactivates the pixel 300. The circuit 302 is defined by a first transistor (T1) (e.g., a first thin-film transistor) that activates an OLED 304 defined by a second transistor (T2) (e.g., a second thin-film transistor). To activate the pixel 300, the circuit 302 includes a switch 306 defined by the first transistor T1 (e.g., a thin-film transistor or semiconductor). The switch 306 is operated (e.g., activated or deactivated) by a gate line 308 and a source line 310. The gate line 308 is illustrative of the sets of gate lines 224, 226 of FIGS. 2A1 and 2B1. The source line 310 is illustrative of the sets of source lines 222 of FIGS. 2A1 and 2B1. The switch 306 controls communication of signals from the source line 310 to a gate 312 of the transistor T2. The transistor T2 and the OLED 304 are connected between a power supply terminal 314 and a ground power supply terminal 316. A source 318 of the transistor T2 is coupled to the power supply terminal 314, and a drain 320 of the transistor T2 is coupled to the OLED 304 (e.g., at the anode terminal of the OLED 304). The OLED 304 (e.g., a cathode terminal of the OLED 304) is coupled to the ground power supply terminal 316. When energized, the gate 312 of the illustrated example generates an electric field (e.g., to create a channel) to cause electrons to flow between the drain 320 and the source 318. Based on the signals 220 (FIGS. 2A1, 2B1) provided to the source line 310 by the display controller 218 (FIGS. 2A1, 2B1), the amount of current flowing between the drain 320 and the source 318 is controlled by a voltage (V) applied between the gate 312 and the source 318.

During operation, the switch 306 is turned on by the gate line 308. The transistor T2 applies current to the OLED 304 based on the signals 220 (e.g., a voltage signal) from the source line 310, The voltage that is applied to the gate 312 of the transistor T2 by the source line 310 via the switch 306 controls a magnitude of a current to the OLED 304, which controls a light intensity of the OLED 304 (e.g., a pixel). A storage capacitor (Cst) 322 can be used to store data on the pixel 300 between successive frames. The example circuit 302 of FIG. 3 is merely illustrative. In some examples, the pixel 300 can be implemented by other circuitry and/or can include any number of transistors (e.g., four transistors, ten transistors, etc.).

Figure 4:
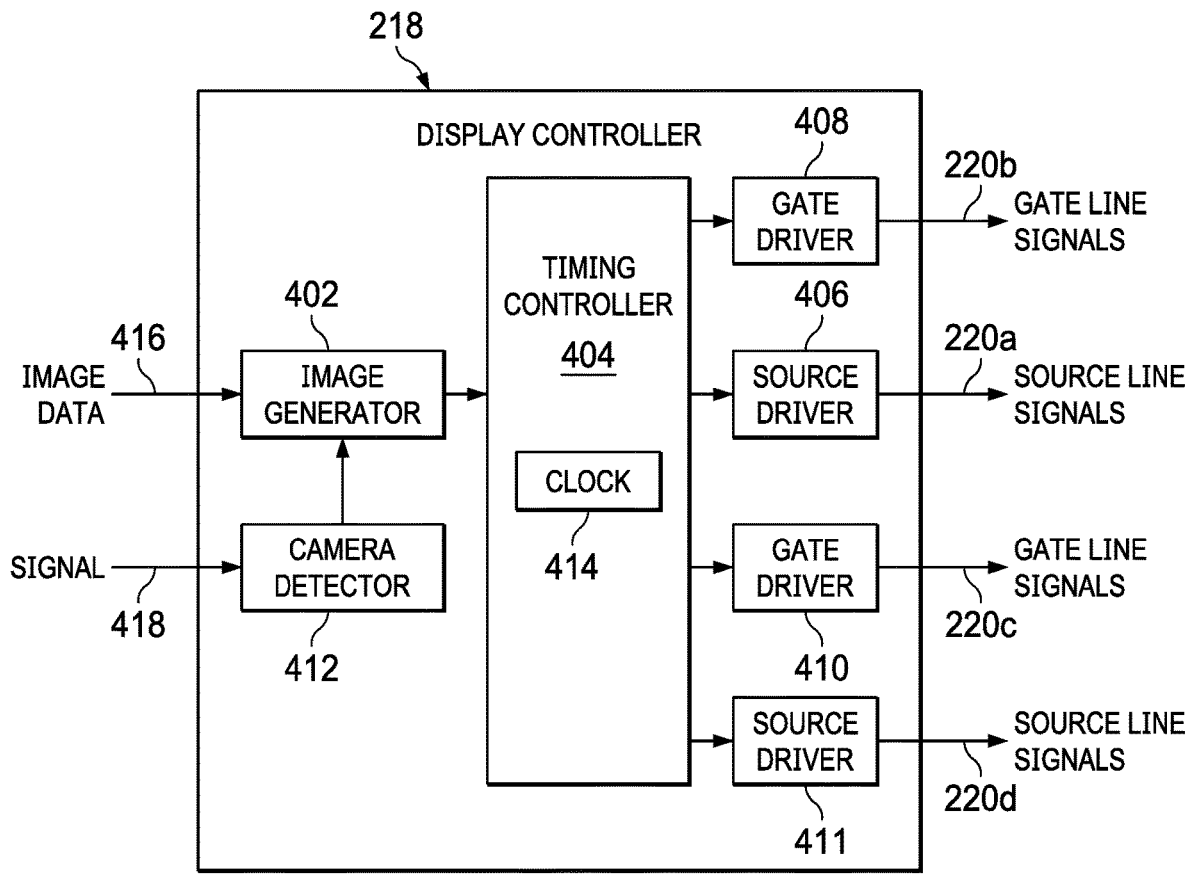
FIG. 4 is a block diagram of an example display controller for controlling displays.

FIG. 4 is a block diagram of an example display controller 218 of FIGS. 2A1, 2B1, The example display controller 218 of the illustrated example includes an example image generator 402, an example timing controller 404, an example source driver 406, an example gate driver 408, an example gate driver 410, an example source driver 411, and an example camera detector 412. The timing controller 404 of the illustrated example includes an example clock 414. In some examples, the example image generator 402, the example timing controller 404, the example source driver 406, the example gate driver 408, the example gate driver 410, and the example source driver 411 are in communication (e.g., via a communication bus, by writing and reading data from a memory, etc.).

The image generator 402 of the illustrated example provides the displays 200, 201 (e.g., FIGS. 2A1, 2B1), as well as other displays described herein, with content that is to be displayed on the viewing area 202 (e.g., FIGS. 2A1, 2B1). The content may include still image content and/or moving image content such as, for example, video content for a movie, moving graphics, or other moving image content represented by image data 416. The image data 416 can be conveyed or transferred to the display controller 218 over a data path (e.g., a flexible circuit cable, input/output interface (e.g., a high-definition multimedia interface (HDMI), a universal serial bus (USB) interface, etc.)). The image generator 402 converts the image data 416 to corresponding data signals to be provided to the pixels 206 of the displays 200, 201. In some examples, the image generator 402 can convert digital signals from the image data 416 to analog signals for the gate driver 408, the gate driver 410, the source driver 406, and/or the source driver 411. For example, the image generator 402 converts the image data 416 to the signals 220 (e.g., voltage signals (Vdata)) for respective ones of the set of source lines 222, the set of gate lines 224, and/or the set of gate lines 226. Thus, in some examples, the image generator 402 can include an analog-to-digital converter and/or other components or converters to convert the image data 416.

To control activation of the pixels 206 of the pixel array 204, the display controller 218 of the illustrated example includes the source driver 406, the gate driver 408, the gate driver 410, and the source driver 411. The source driver 406 of the illustrated example provides the signals 220a (e.g., voltage signals, current signals, etc.) from the image generator 402 to the source lines 222. The source driver 411 also provides signals for the source lines 222 in examples implementing a second source driver interface, such as the examples described further below. The gate driver 408 of the illustrated example provides the signals 220b (e.g., voltage signals, current signals, etc.) from the image generator 402 to the gate driver interface 230. The gate driver 410 of the illustrated example provides the signals 220c (e.g., voltage signals, current signals, etc.) from the image generator 402 to the gate driver interface 232.

For example, for a particular image, the image generator 402 and/or the source driver 406 of the illustrated example determines which pixels 206 of the pixel array 204 should be activated to generate the image and distributes the signals 220a to the pixels 206 via the set of source lines 222. Additionally, the image generator 402 and/or the gate driver 408 determines which pixels 206 of the pixel array 204 should be activated and provides the signals 220b (e.g., voltage signals, current signals, etc.) to the pixels 206 accordingly. Likewise, the image generator 402 and/or the gate driver 410 determines which pixels 206 of the pixel array 204 should be activated and provides the signals 220c (e.g., voltage signals, current signals, etc.) to the pixels 206 accordingly.

To control or coordinate timing of signals 220a from the source driver 406 to respective ones of the source lines 222, and of the signals 220b from the gate driver 408 and/or the gate driver 410 to respective gate lines in the sets of gate lines 224 and/or 226, the displays 200, 201 of the illustrated example includes the timing controller 404. The timing controller 404 includes the clock 414 to enable proper timing and/or activation of the pixels 206 of the pixel array 204 to generate an image on the viewing area 202. In examples, the timing controller 404 drives either the gate lines consecutively (as described herein) or the source lines consecutively (as described herein), but in such examples, both gate lines and source lines are not driven consecutively at the same time.

The camera detector 412 determines when the camera 212 (e.g., FIGS. 2A1, 2B1) is in use. To determine when the camera 212 is in use, the camera detector 412 receives a signal 418. The signal 418 may be provided by a camera application of an electronic device (e.g., the electronic devices 100a-d) representative of the camera application being in an active condition (e.g., a non-sleep mode or an in-use mode). The camera detector 412 communicates a status of the camera 212 to the image generator 402. When the camera detector 412 detects that the camera 212 is in use, the image generator 402 provides commands to the source driver 406, the gate driver 408, and/or the gate driver 410 to deactivate the pixels 206 that overlap with the camera 212 and/or define the transparent area 216 of the viewing area 202 of the displays 200, 201. In this manner, an image being presented across the transparent area 216 can be removed when the camera 212 is in use so that the presented image does not interfere with the operation of the camera 212.

While an example manner of implementing the display controller 218 is illustrated in FIG. 4, the elements, processes, and/or devices illustrated in FIG. 4 may be combined, divided, re-arranged, omitted, eliminated, and/or implemented in any other way. Further, the example image generator 402, the example timing controller 404, the example source driver 406, the example gate driver 408, the example gate driver 410, the example source driver 411, the camera detector 412, the clock 414, and/or, more generally, the example display controller 218 of FIG. 4 may be implemented by hardware, machine-executable instructions, or a combination thereof. Thus, for example, any of the example image generator 402, the example timing controller 404, the example source driver 406, the example gate driver 408, the example gate driver 410, the example source driver 411, the camera detector 412, the clock 414, and/or, more generally, the example display controller 218 of FIG. 4 may be implemented by analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). Further still, the example display controller 218 of FIG. 4 may include elements, processes, and/or devices in addition to, or instead of, those illustrated in FIG. 4, and/or may include more than one of any of the illustrated elements, processes, and devices. As used herein, the phrase "in communication," including variations thereof, encompasses direct communication and/or indirect communication through intermediary components, and does not call for direct physical (e.g., wired) communication and/or constant communication, but rather additionally includes selective communication at periodic intervals, scheduled intervals, aperiodic intervals, and/or one-time events.

FIG. 5A1 depicts another example display 1100 disclosed herein. Many of the components of the example display 1100 of FIG. 5A1 are substantially the same as the components disclosed above in connection with FIGS. 2A1, 2B1, 3, and 4. As such, those components are not described in detail again. Like reference numbers are used for like structures in FIG. 5A1 as used in FIGS. 2A1, 2B1, 3, and 4.

The location of the camera 212 is not limited to being positioned adjacent an edge (e.g., the edge 276) of the display 1100. For example, the camera 212 may be positioned at any suitable location in a viewing area 202 of the display 1100. In the illustrated example of FIG. 5A1, the display 1100 includes a transparent area 1102 formed at a central location 1104 of the viewing area 202 of the display 1100. For example, the central location 1104 can be located at a midsection 266 of the viewing area 202 between the edge 264 and the edge 268, and approximately equidistant from the edge 274 and edge 276. The display 1100 of the illustrated example includes a set of gate lines 1106 and a set of source lines 1110. Multiple gate lines in the set of gate lines 1106 and multiple source lines in the set of source lines 1110 include transparent portions 1114. To avoid degradation of the signals 220 across transparent portions 1114, gaps 1151 are formed between terminating ends of the respective set of gate lines 1106 and the set of source lines 1110. In examples, the gate driver 1120 drives at least some of the gate lines in the set of gate lines 1106. In examples, the gate driver 1122 drives at least some of the gate lines in the set of gate lines 1106. In examples, the source driver 1124 drives at least some of the source lines in the set of source lines 1110. In examples, the source driver 1126 drives at least some of the source lines in the set of source lines 1110. The viewing area 202 outside of the transparent area 1102 of the illustrated example is opaque.

FIG. 5A2 depicts an example operation of the display 1100, in accordance with various examples. In this example operation, a pair of gate lines is driven consecutively. Specifically, the display controller 218 of the display 1100 drives the gate line 11 (501); drives the gate line 12 consecutively with gate line 11 (502); drives gate line 13 consecutively with gate line 12 (503); and drives gate line 14 consecutively with gate line 13 (504). The gate lines 15A and 15B may then be driven in any suitable order. For example, the display controller 218 may drive the gate line 15A consecutively with gate line 14 (505); drive gate line 15B consecutively with gate line 15A (506); and drive gate line 16 consecutively with gate line 15B (507). In examples, in lieu of 505-507, the display controller 218 may drive gate line 15B consecutively with gate line 14 (508); drive gate line 15A consecutively with gate line 15B (509); and drive gate line 16 consecutively with gate line 15A (510). Regardless of whether the display controller 218 performs 505-507 or 508-510, the display controller 218 then drives gate line 17 consecutively with gate line 16 (511); drives gate line 18 consecutively with gate line 17 (512); drives gate line 19 consecutively with gate line 18 (513); and drives gate line 20 consecutive with gate line 19 (514). In this way, the display controller 218 drives the gate lines 15A and 15B consecutively, regardless of the order in which they are driven. As a result, the left and right sides of the display 1100 at the gate lines 15A and 15B are refreshed nearly simultaneously, thus providing the benefits described above with respect to FIG. 2A2, The order of the operation of FIG. 5A2 may be modified as desired, such as by reversing the order of the example operation (e.g., by driving gate line 20, then gate line 19, then gate line 18, and so on).

FIG. 5A3 depicts another example operation of the display 1100, in accordance with various examples. The example operation of FIG. 5A3 is nearly the same as that of FIG. 5A2. However, in this example operation, the display controller 218 does not drive the gate lines 15A and 15B consecutively, but the display controller 218 still drives the gate lines 15A and 15B within two gate time periods of each other, thereby preserving the benefits described above with respect to FIG. 2A2. In particular, the display controller 218 drives gate line 11 (515); drives gate line 12 consecutively with gate line 11 (516); drives gate line 13 consecutively with gate line 12 (517); drives gate line 14 consecutively with gate line 13 (518); drives gate line 15A consecutively with gate line 14 (519); drives gate line 16 consecutively with gate line 15A (520); drives gate line 15B consecutively with gate line 16 and within two gate time periods of driving gate line 15A (521); drives gate line 17 consecutively with gate line 15B (522); drives gate line 18 consecutively with gate line 17 (523); drives gate line 19 consecutively with gate line 18 (524); and drives gate line 20 consecutively with gate line 19 (525). In examples, the order of operation in FIG. 5A3 may be reversed (e.g., driving gate line 20, then gate line 19, then gate line 18, and so on).

The display controller 218 drives the gate lines of FIG. 5A1 using the example operations of FIGS. 5A2 and 5A3. FIGS. 5A4 and 5A5 depict example operations for the display 1100 in which the display controller 218 drives the source lines of the display 1100 analogously to the gate line operations of FIGS. 5A2 and 5A3, respectively. In the example operation of FIG. 5A4, the display controller 218 drives source line 21 (526); drives source line 22 consecutively with source line 21 (527); drives source line 23 consecutively with source line 22 (528); drives source line 24 consecutively with source line 23 (529); drives source line 25 consecutively with source line 24 (530); drives source line 26 consecutively with source line 25 (531); drives source line 27 consecutively with source line 26 (532); drives source line 28A consecutively with source line 27 (533); drives source line 28B consecutively with source line 28A (534); drives source line 29 consecutively with source line 28B (535); drives source line 30 consecutively with source line 29 (536); drives source line 31 consecutively with source line 30 (537); drives source line 32 consecutively with source line 31 (538); drives source line 33 consecutively with source line 32 (539); and drives source line 34 consecutively with source line 33 (540). In examples, instead of driving the source line 28A prior to the source line 286, the display controller 218 drives the source line 286 prior to (but consecutively with) the source line 28A. In examples, the order of the example operations in FIG. 5A4 may be reversed (e.g., driving source line 34, then source line 33, then source line 32, and so on).

In the example operation of FIG. 5A5, the display controller 218 drives source line 21 (541); drives source line 22 consecutively with source line 21 (542); drives source line 23 consecutively with source line 22 (543); drives source line 24 consecutively with source line 23 (544); drives source line 25 consecutively with source line 24 (545); drives source line 26 consecutively with source line 25 (546); drives source line 27 consecutively with source line 26 (547); drives source line 28A consecutively with source line 27 (548); drives source line 29 consecutively with source line 28A (549); drives source line 28B consecutively with source line 29 and within two source time periods of driving source line 28A (550); drives source line 30 consecutively with source line 28B (551); drives source line 31 consecutively with source line 30 (552); drives source line 32 consecutively with source line 31 (553); drives source line 33 consecutively with source line 32 (554); and drives source line 34 consecutively with source line 33 (555). In examples, the order of the example operation of FIG. 5A5 may be reversed (e.g., driving source line 34, then source line 33, then source line 32, and so on).

FIG. 5B1 depicts a display 1101 in accordance with various examples. The display 1101 is the same as that of the display 1100, except that gaps 1151 are present between multiple pairs of gate lines and multiple pairs of source lines. In particular, the display 1101 comprises the following pairs of gate lines, each pair separated by a gap 1151: a pair of gate lines 11A and 11B; a pair of gate lines 12A and 12B; a pair of gate lines 13A and 13B; a pair of gate lines 14A and 14B; a pair of gate lines 15A and 15B; a pair of gate lines 16A and 16B; a pair of gate lines 17A and 17B; a pair of gate lines 18A and 18B; a pair of gate lines 19A and 19B; and a pair of gate lines 20A and 20B. Likewise, the display 1101 comprises the following pairs of source lines, each pair separated by a gap 1151; a pair of source lines 21A and 21B; a pair of source lines 22A and 22B; a pair of source lines 23A and 23B; a pair of source lines 24A and 24B; a pair of source lines 25A and 25B; a pair of source lines 26A and 26B; a pair of source lines 27A and 27B; a pair of source lines 28A and 28B; a pair of source lines 29A and 29B; a pair of source lines 30A and 30B; a pair of source lines 31A and 31B; a pair of source lines 32A and 32B; a pair of source lines 33A and 33B; and a pair of source lines 34A and 34B.

FIG. 5B2 depicts an example operation according to which the display controller 218 drives multiple pairs of gate lines of the display 1101 consecutively. In the example operation, the display controller 218 drives gate line 11A (556); drives gate line 11B consecutively with gate line 11A (557); drives gate line 12A consecutively with gate line 11B (558); drives gate line 12B consecutively with gate line 12A (559); drives gate line 13A consecutively with gate line 12B (560); drives gate line 13B consecutively with gate line 13A (561); drives gate line 14A consecutively with gate line 13B (562); drives gate line 14B consecutively with gate line 14A (563); drives gate line 15A consecutively with gate line 14B (564); drives gate line 15B consecutively with gate line 15A (565); drives gate line 16A consecutively with gate line 15B (566); drives gate line 16B consecutively with gate line 16A (567); drives gate line 17A consecutively with gate line 16B (568); drives gate line 17B consecutively with gate line 17A (569); drives gate line 18A consecutively with gate line 17B (570); drives gate line 18B consecutively with gate line 18A (571); drives gate line 19A consecutively with gate line 18B (572); drives gate line 19B consecutively with gate line 19A (573); drives gate line 20A consecutively with gate line 19B (574); and drives gate line 20B consecutively with gate line 20A (575). In examples, the order of the example operation in FIG. 5B2 may be reversed (e.g., driving gate line 20B, then driving gate line 20A consecutively with 206, then driving gate line 19B consecutively with gate line 20A, and so on; in other examples, driving gate line 20A, then driving gate line 20B consecutively with gate line 20A, then driving gate line 19A consecutively with gate line 206, and so on).

FIG. 5B3 depicts an example operation according to which the display controller 218 drives one (or more) pair of gate lines of the display 1101 non-consecutively but within a predetermined time of each other. In particular, the display controller 218 drives gate line 11A (576); drives gate line 11B consecutively with gate line 11A (577); drives gate line 12A consecutively with gate line 11B (578); drives gate line 12B consecutively with gate line 12A (579); drives gate line 13A consecutively with gate line 12B (580); drives gate line 13B consecutively with gate line 13A (581); drives gate line 14A consecutively with gate line 13B (582); drives gate line 14B consecutively with gate line 14A (583); drives gate line 15A consecutively with gate line 14B (584); drives gate line 16A consecutively with gate line 15A (585); drives gate line 15B consecutively with gate line 16A and within two gate time periods of driving gate line 15A (586); drives gate line 16B consecutively with gate line 15B and within two gate time periods of driving gate line 16A (587); drives gate line 17A consecutively with gate line 16B (588); drives gate line 17B consecutively with gate line 17A (589); drives gate line 18A consecutively with gate line 17B (590); drives gate line 18B consecutively with gate line 18A (591); drives gate line 19A consecutively with gate line 18B (592); drives gate line 19B consecutively with gate line 19A (593); drives gate line 20A consecutively with gate line 19B (594); and drives gate line 20B consecutively with gate line 20A (595). In examples, the order of the example operation in FIG. 5B3 is reversed (e.g., gate line 17A, then gate line 16B consecutively with gate line 17A, then gate line 15B consecutively with gate line 166, then gate line 16A consecutively with gate line 15B and within two gate time periods of gate line 16B, then gate line 15A consecutively with gate line 16A and within two gate time periods of gate line 15B, and so on).

FIG. 5B4 depicts an example operation according to which the display controller 218 drives multiple pairs of source lines of the display 1101 consecutively. Specifically, the display controller 218 drives source line 21A (601); drives source line 21B consecutively with source line 21A (602); drives source line 22A consecutively with source line 21B (603); drives source line 22B consecutively with source line 22A (604); drives source line 23A consecutively with source line 22B (605); drives source line 23B consecutively with source line 23A (606); drives source line 24A consecutively with source line 23B (607); drives source line 24B consecutively with source line 24A (608); drives source line 25A consecutively with source line 24B (609); drives source line 25B consecutively with source line 25A (610); drives source line 26A consecutively with source line 25B (611); drives source line 26B consecutively with source line 26A (612); drives source line 27A consecutively with source line 26B (613); drives source line 27B consecutively with source line 27A (614); drives source line 28A consecutively with source line 27B (615); drives source line 28B consecutively with source line 28A (616); drives source line 29A consecutively with source line 28B (617); drives source line 29B consecutively with source line 29A (618); drives source line 30A consecutively with source line 29B (619); drives source line 30B consecutively with source line 30A (620); drives source line 31A consecutively with source line 30B (621); drives source line 31B consecutively with source line 31A (622); drives source line 32A consecutively with source line 31B (623); drives source line 32B consecutively with source line 32A (624); drives source line 33A consecutively with source line 32B (625); drives source line 33B consecutively with source line 33A (626); drives source line 34A consecutively with source line 33B (627); and drives source line 34B consecutively with source line 34A (628). The order of the example operation in FIG. 5B4 may be reversed (e.g., the source line 34B is driven, followed by source line 34A consecutively with 34B, then source line 33B consecutively with source line 34A, and so on; in other examples, source line 34A is driven, followed by source line 34B consecutively with source line 34A, then source line 33A consecutively with source line 34B, and so on).

FIG. 5B5 depicts an example operation according to which the display controller 218 drives pairs of source lines of the display 1101 consecutively, with at least one pair of source lines driven non-consecutively but within a predetermined amount of time of each other. In particular, the display controller 218 drives source line 21A (630); drives source line 21B consecutively with source line 21A (631); drives source line 22A consecutively with source line 21B (632); drives source line 22B consecutively with source line 22A (633); drives source line 23A consecutively with source line 223 (634); drives source line 23B consecutively with source line 23A (635); drives source line 24A consecutively with source line 23B (636); drives source line 24B consecutively with source line 24A (637); drives source line 25A consecutively with source line 24B (638); drives source line 26A consecutively with source line 25A (639); drives source line 25B consecutively with source line 26A and within two source time periods of driving source line 25A (640); drives source line 26B consecutively with source line 25B and within two source time periods of driving source line 26A (641); drives source line 27A consecutively with source line 263 (642); drives source line 27B consecutively with source line 27A (643); drives source line 28A consecutively with source line 27B (644); drives source line 28B consecutively with source line 28A (645); drives source line 29A consecutively with source line 28B (646); drives source line 293 consecutively with source line 29A (647); drives source line 30A consecutively with source line 29B (648); drives source line 30B consecutively with source line 30A (649); drives source line 31A consecutively with source line 30B (650); drives source line 313 consecutively with source line 31A (651); drives source line 32A consecutively with source line 31B (652); drives source line 32B consecutively with source line 32A (653); drives source line 33A consecutively with source line 32B (654); drives source line 33B consecutively with source line 33A (655); drives source line 34A consecutively with source line 33B (656); and drives source line 34B consecutively with source line 34A (657). In examples, the operation of FIG. 5B5 may be reversed (e.g., the source line 34B is driven, then source line 34A consecutively with source line 34B, then source line 336 consecutively with source line 34A, and so on; in other examples, the source line 34A is driven, then source line 34B consecutively with source line 34A, then source line 33A consecutively with source line 34B, and so on).

As explained above, the location of the camera 212 is not restricted to any particular location in the viewing area 202. For example, in FIGS. 2A1 and 2B1, the camera 212 is positioned at a top end of the viewing area 202. In FIGS. 5A1 and 5B1, the camera 212 is positioned at a center of the viewing area 202. The camera 212 may be positioned in still other locations, for example, at a far right or far left end of the viewing area 202. Accordingly, FIG. 6A1 depicts a display 1150 in which the camera 212 is positioned at a far right end of the viewing area 202. Display 1150 comprises source lines 1162 and 1163, which are separated by a gap 1165. In examples, the remaining source lines 1154 in the display 1150 do not contain gaps and extend from the source driver 1164 to the source driver 1166. In addition, the display 1150 comprises multiple gate lines 1156. In examples, the multiple gate lines 1156 do not contain gaps and extend from the gate driver 1168 to the edge (or end) 268 of the display 1150.

The source lines 1162 and 1163 are composed of both opaque and transparent material. Specifically, the portions of the source lines 1162 and 1163 that are positioned within the transparent area 216 are transparent, and portions of the source lines 1162 and 1163 that are positioned outside of the transparent area 216 are opaque. The remaining source lines 1154 are opaque. The portion of the gate line 1161 that is positioned within the transparent area 216 is transparent, and the portion of the gate line 1161 that is positioned outside the transparent area 216 is opaque. The remaining gate lines 1156 are opaque. The source driver 1164 drives at least some of the source lines in the display 1150, and the source driver 1166 drives at least some of the source lines in the display 1150. The gate driver 1168 drives the gate lines in the display 1150.

FIG. 6A2 depicts an example operation according to which the display controller 218 may drive pairs of source lines of the display 1150 consecutively. The source lines of display 1150 are numbered 45-58B (FIG. 6A1) for reference. In particular, the display controller 218 drives the source line 45 (660); drives the source line 46 consecutively with source line 45 (661); drives the source line 47 consecutively with source line 46 (662); drives the source line 48 consecutively with source line 47 (663); drives the source line 49 consecutively with source line 48 (664); drives source line 50 consecutively with source line 49 (665); drives source line 51 consecutively with source line 50 (666); drives source line 52 consecutively with source line 51 (667); drives source line 53 consecutively with source line 52 (668); drives source line 54 consecutively with source line 53 (669); drives source line 55 consecutively with source line 54 (670); drives source line 56 consecutively with source line 55 (671); and drives source line 57 consecutively with source line 56 (672). In examples, the display controller 218 then drives the source line 58A consecutively with the source line 57 (673) and source line 58B consecutively with source line 58A (674). In other examples, the display controller 218 drives source line 58B consecutively with source line 57 (675) and source line 58A consecutively with source line 58B (676). In examples, the order of operation in FIG. 6A2 may be reversed (e.g., by driving source line 58B, then source line 58A, then source line 57, and so on; in other examples, by driving source line 58A, then source line 58B, then source line 57, and so on).

FIG. 6A3 depicts another example operation according to which the display controller 218 may drive a pair of source lines of the display 1150 non-consecutively but within a predetermined time of each other. In particular, the display controller 218 drives the source line 45 (677); drives the source line 46 consecutively with source line 45 (678); drives the source line 47 consecutively with source line 46 (679); drives the source line 48 consecutively with source line 47 (680); drives the source line 49 consecutively with source line 48 (681); drives source line 50 consecutively with source line 49 (682); drives source line 51 consecutively with source line 50 (683); drives source line 52 consecutively with source line 51 (684); drives source line 53 consecutively with source line 52 (685); drives source line 54 consecutively with source line 53 (686); drives source line 55 consecutively with source line 54 (687); drives source line 56 consecutively with source line 55 (688); and drives source line 57 consecutively with source line 56 (689). In examples, the display controller 218 then drives the source line 58A consecutively with the source line 57 (690); source line 45 consecutively with source line 58A (691); and source line 58B consecutively with source line 45 and within two source time periods of driving source line 58A (692). In examples, the order of operation in FIG. 6A3 may be reversed (e.g., by driving source line 58B, then source line 45, then source line 58A within two source time periods of driving source line 58B, then source line 57, and so on).

FIG. 6B1 depicts an example of a display 1153 that is the same as that of the display 1150 of FIG. 6A1 but that includes gaps 1165 between multiple source lines 1154. In particular, the display 1153 includes the following pairs of source lines, separated by a gap 1165: source lines 45A and 45B; source lines 46A and 46B; source lines 47A and 47B; source lines 48A and 48B; source lines 49A and 49B; source lines 50A and 50B; source lines 51A and 51B; source lines 52A and 52B; source lines 53A and 53B; source lines 54A and 54B; source lines 55A and 55B; source lines 56A and 56B; source lines 57A and 57B; and source lines 58A and 58B.

FIG. 6B2 depicts an example operation of the display 1153 of FIG. 6B1 in which multiple pairs of source lines are driven consecutively. In particular, the display controller 218 drives source line 45A (693); drives source line 45B consecutively with source line 45A (694); drives source line 46A consecutively with source line 45B (695); drives source line 46B consecutively with source line 46A (696); drives source line 47A consecutively with source line 46B (697); drives source line 47B consecutively with source line 47A (698); drives source line 48A consecutively with source line 47B (699); drive source line 48B consecutively with source line 48A (700); drives source line 49A consecutively with source line 48B (701); drives source line 49B consecutively with source line 49A (702); drives source line 50A consecutively with source line 49B (703); drives source line 50B consecutively with source line 50A (704); drives source line 51A consecutively with source line 50B (705); drives source line 51B consecutively with source line 51A (706); drives source line 52A consecutively with source line 51B (707); drives source line 52B consecutively with source line 52A (708); drives source line 53A consecutively with source line 52B (709); drives source line 53B consecutively with source line 53A (710); drives source line 54A consecutively with source line 53B (711); drives source line 54B consecutively with source line 54A (712); drives source line 55A consecutively with source line 54B (713); drives source line 55B consecutively with source line 55A (714); drives source line 56A consecutively with source line 55B (715); drives source line 56B consecutively with source line 56A (716); drives source line 57A consecutively with source line 56B (717); drives source line 57B consecutively with source line 57A (718); drives source line 58A consecutively with source line 57B (719); and drives source line 58B consecutively with source line 58A (720). In examples, the order of operation in FIG. 6B2 may be reversed (e.g., by driving source line 58B, then source line 58A, then source line 57B, and so on; in other examples, by driving source line 58A, then source line 58B, then source line 57A, and so on).

FIG. 6B3 depicts another example operation of the display 1153 of FIG. 6B1, in which at least one pair of source lines is driven non-consecutively but within a predetermined amount of time of each other. In particular, the display controller 218 drives source line 45A (721); drives source line 45B consecutively with source line 45A (722); drives source line 46A consecutively with source line 45B (723); drives source line 46B consecutively with source line 46A (724); drives source line 47A consecutively with source line 46B (725); drives source line 47B consecutively with source line 47A (726); drives source line 48A consecutively with source line 47B (727); drive source line 48B consecutively with source line 48A (728); drives source line 49A consecutively with source line 48B (729); drives source line 49B consecutively with source line 49A (730); drives source line 50A consecutively with source line 49B (731); drives source line 50B consecutively with source line 50A (732); drives source line 51A consecutively with source line 50B (733); drives source line 51B consecutively with source line 51A (734); drives source line 52A consecutively with source line 51B (735); drives source line 52B consecutively with source line 52A (736); drives source line 53A consecutively with source line 52B (737); drives source line 53B consecutively with source line 53A (738); drives source line 54A consecutively with source line 53B (739); drives source line 54B consecutively with source line 54A (740); drives source line 55A consecutively with source line 54B (741); drives source line 55B consecutively with source line 55A (742); drives source line 56A consecutively with source line 55B (743); drives source line 56B consecutively with source line 56A (744); drives source line 57A consecutively with source line 56B (745); drives source line 58A consecutively with source line 57A (746); drives source line 57B consecutively with source line 58A and within two source time periods of driving source line 57A (747); and drives source line 58B consecutively with source line 57B and within two source time periods of driving source line 58A (748). In examples, the order of operations of FIG. 6B3 may be reversed (e.g., by driving source line 58B, then driving source line 57B, then driving source line 58A within two source time periods of driving source line 58B, then driving source line 57A within two source time periods of driving source line 57B, and so on).

Figure 7:
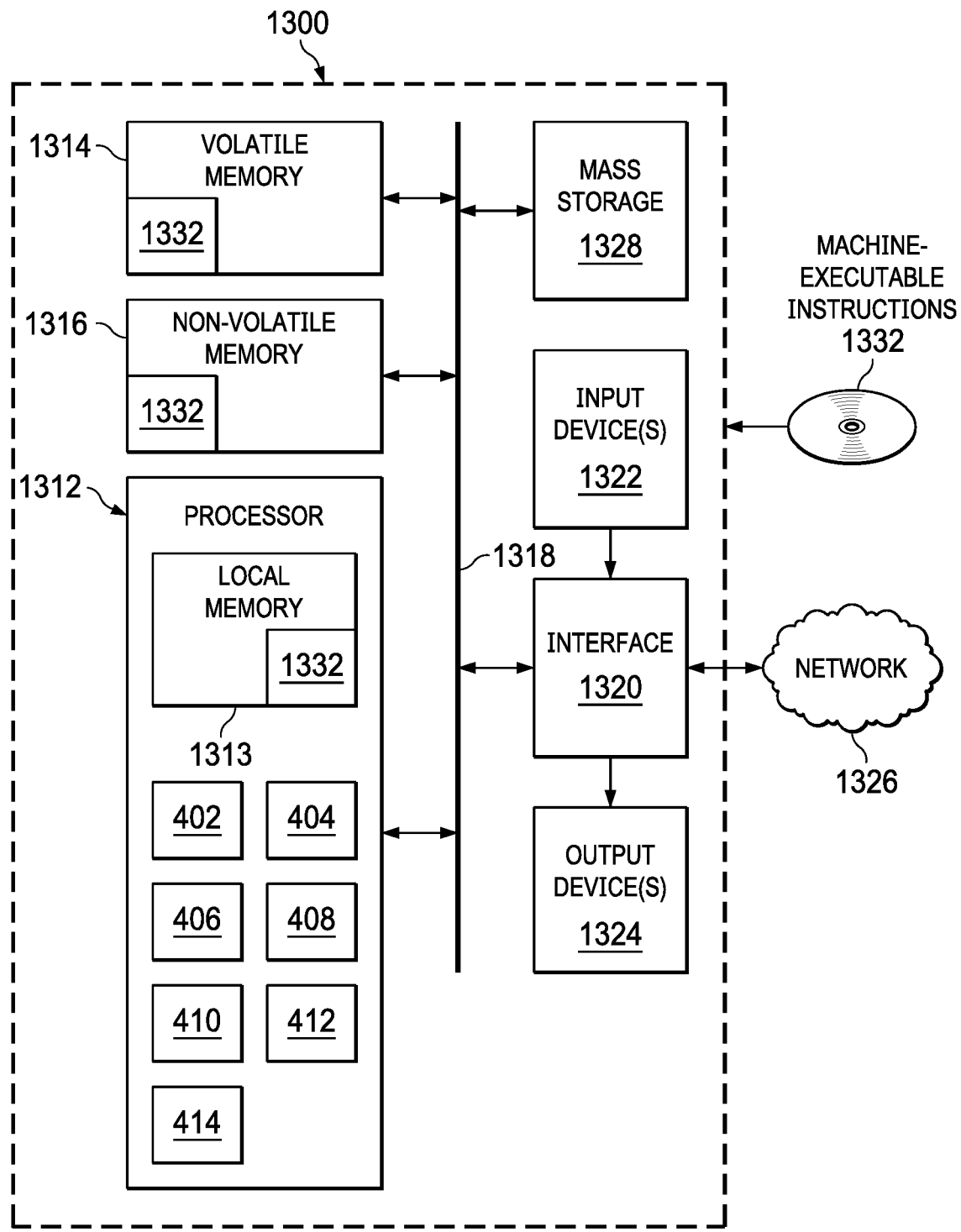
FIG. 7 is a block diagram of part of an example electronic device that may be used to implement the example methods and apparatuses disclosed herein.

FIG. 7 is a block diagram of an example processor platform 1300 structured to execute instructions to implement the display controller 218. For example, the processor platform 1300 may execute instructions to perform the various actions attributed herein to the display controller 218, such as in FIGS. 2A2, 2A3, 2B2, 2B3, 5A2-5A5, 5B2-5B5, 6A2, 6A3, 6B2, and 6B3. The processor platform 1300 can be, for example, a server, a personal computer, a workstation, a self-learning machine (e.g., a neural network), a mobile device (e.g., a cell phone, a smart phone, a tablet computer), a personal digital assistant (PDA), an Internet appliance, a digital video disc (DVD) player, a compact disc (CD) player, a digital video recorder, a Blu-ray player, a gaming console, a personal video recorder, a set top box, a kiosk, a headset or other wearable device, or any other type of computing device.

The processor platform 1300 of the illustrated example includes a processor 1312. The processor 1312 of the illustrated example is hardware. For example, the processor 1312 can be implemented by integrated circuits, logic circuits, microprocessors, GPUs, DSPs, or controllers from any desired family or manufacturer. The hardware processor may be a semiconductor based (e.g., silicon based) device. In this example, the processor implements at least the image generator, the camera detector, the timing controller, and the gate and source drivers.

The processor 1312 of the illustrated example includes a local memory 1313 (e.g., a cache). The processor 1312 of the illustrated example is in communication with a main memory including a volatile memory 1314 and a nonvolatile memory 1316 via a bus 1318. Access to the volatile memory 1314 and nonvolatile memory 1316 is controlled by a memory controller. The processor platform 1300 of the illustrated example also includes an interface circuit 1320. The interface circuit 1320 may be implemented by any type of interface standard, such as an Ethernet interface, a universal serial bus (USB), a BLUETOOTH® interface, a near field communication (NFC) interface, and/or a peripheral component interconnect (PCI) express interface.

In the illustrated example, input devices 1322 are connected to the interface circuit 1320. The input device(s) 1322 permit(s) a user to enter data and/or commands into the processor 1312. The input device(s) can be implemented by, for example, an audio sensor, a microphone, a camera (still or video), a keyboard, a button, a mouse, a touchscreen, a track-pad, a trackball, isopoint, and/or a voice recognition system.

Output devices 1324 are also connected to the interface circuit 1320 of the illustrated example. The output devices 1324 can be implemented, for example, by display devices (e.g., a light emitting diode (LED), an organic light emitting diode (OLED), a touchscreen, etc.), a tactile output device, a printer, and/or a speaker. The interface circuit 1320 of the illustrated example, thus, includes a graphics driver card, a graphics driver chip, and/or a graphics driver processor.

The interface circuit 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1326. The communication can be via, for example, an Ethernet connection, a digital subscriber line (DSL) connection, a telephone line connection, a coaxial cable system, a satellite system, a line-at-site wireless system, a cellular telephone system, etc.

The processor platform 1300 of the illustrated example also includes mass storage devices 1328 for storing machine-executable instructions and/or data. Examples of such mass storage devices 1328 include floppy disk drives, hard drive disks, compact disk drives, Blu-ray disk drives, redundant array of independent disks (RAID) systems, and digital versatile disk (DVD) drives.

The machine-executable instructions 1332 to implement the display controller 218 may be stored in the mass storage device 1328, in the volatile memory 1314, in the non-volatile memory 1316, and/or on a removable nontransitory computer readable storage medium such as a compact disc (CD) or DVD. Such machine-executable instructions may be executed by the processor 1312 to perform the various actions attributed herein to the display controller 218, such as in FIGS. 2A2, 2A3, 2B2, 2B3, 5A2-5A5, 5B2-5B5, 6A2, 6A3, 6B2, and 6B3.

The above discussion is meant to be illustrative of the principles and various examples of the present disclosure. Numerous variations and modifications will become apparent to those skilled in the art once the above disclosure is fully appreciated. It is intended that the following claims be interpreted to embrace such variations and modifications.

What is claimed is:

1. An electronic device, comprising:
   a camera;
   a display having a transparent area aligned with the camera, the display comprising:
      a first line corresponding to a pixel row or column of the display, the first line extending from a first end of the display to the transparent area; and
      a second line corresponding to the pixel row or column and extending from a second end of the display to the transparent area, the first and second lines separated by a gap;
   a first drive interface at the first end of the display;
   a second drive interface at the first end of the display; and
   a controller coupled to the display,
   wherein the controller is to drive the first line via the first drive interface and the second line via the second drive interface consecutively.

2. The electronic device of claim 1, wherein the first and second lines are a pair of gate lines positioned in a same row in the display.

3. The electronic device of claim 1, wherein the first and second lines are source lines.

4. The electronic device of claim 1, wherein the display comprises:
   a third line corresponding to a second pixel row or column of the display that is consecutive with the pixel row or column, the third line extending from the first end to the second end without passing through the transparent area, the third line composed of an opaque material,
   wherein the controller is to drive the third line consecutive with the first line.

5. The electronic device of claim 1, wherein the display comprises:
   a third line corresponding to a second pixel row or column of the display, the third line extending from the first end to an area of the display without passing through the transparent area, the third line composed of an opaque material; and
   a fourth line corresponding to the second pixel row or column, the fourth line extending from the second end to the area of the display without passing through the transparent area, the fourth line composed of the opaque material,
   wherein the controller is to drive the third and fourth lines consecutively.

6. The electronic device of claim 1, wherein the first line is composed of a transparent material and an opaque material, and wherein the second line is composed of the transparent material and the opaque material.

7. The electronic device of claim 1, wherein the display comprises a first group of lines and a second group of lines, the first and second lines belonging to the second group of lines, wherein the controller is to drive the first group of lines according to a first consecutive pattern and the second group of lines according to a second consecutive pattern that differs from the first consecutive pattern.

8. An electronic device, comprising:
   a display having a transparent area, the display comprising:
      a first gate line corresponding to a first pixel row of the display, the first gate line composed of an opaque material;

a second gate line corresponding to a second pixel row of the display that is consecutive with the first pixel row, the second gate line extending from a first end of the display to the transparent area, the second gate line composed of the opaque material and a transparent material; and a third gate line corresponding to the second pixel row and extending from a second end of the display to the transparent area, the third gate line composed of the opaque and transparent materials; and a controller coupled to the display, the controller to drive the first and second gate lines consecutively and the second and third gate lines consecutively, wherein the second and third gate lines are separated by a gap.

9. The electronic device of claim 8, the display comprising:

a first source line corresponding to a first pixel column of the display and extending from a third end of the display to the transparent area, the first source line composed of the opaque material and the transparent material; and a second source line corresponding to the first pixel column and extending from a fourth end of the display to the transparent area, the second source line composed of the opaque material and the transparent material, wherein the controller is to drive the first and second source lines consecutively.

10. The electronic device of claim 8 comprising a camera positioned behind the transparent area.

11. A non-transitory computer-readable medium storing machine-executable instructions, which, when executed by a controller, causes the controller to:

drive a first gate line of a display, the first gate line corresponding to a pixel row of the display and extending from a first end of the display to an area of the display; and drive a second gate line of the display, the second gate line corresponding to the pixel row and extending from a second end of the display to the area, the controller is to drive the first gate line within two gate time periods of the second gate line; and drive a third line consecutive with the first gate line, the third line corresponding to a second pixel row or column of the display that is consecutive with the pixel row or column, the third line extending from the first end to the second end without passing through a transparent area, the third line composed of an opaque material, wherein the first and second gate lines extend into the transparent area of the display.

12. The non-transitory computer-readable medium of claim 11, wherein the instructions, when executed by the controller, cause the controller to drive the second gate line consecutively with the first gate line.

13. The non-transitory computer-readable medium of claim 11, wherein the instructions, when executed by the controller, cause the controller to drive the first gate line non-consecutively with the second gate line.

14. The non-transitory computer-readable medium of claim 11, wherein the instructions, when executed by the controller, cause the controller to:

drive a third line corresponding to a second pixel row or column of the display, the third line extending from the first end to an area of the display without passing through the transparent area, the third line composed of an opaque material; and drive a fourth line consecutive with the third line, the fourth line corresponding to the second pixel row or column, the fourth line extending from the second end to the area of the display without passing through the transparent area, the fourth line composed of the opaque material.

* * * * *